US012777885B2

(12) United States Patent
Um et al.

(10) Patent No.: US 12,777,885 B2
(45) Date of Patent: Oct. 27, 2026

(54) WAFER CLEANING APPARATUS AND WAFER CLEANING SYSTEM INCLUDING THE SAME

(71) Applicant: Samsung Electronics Co., Ltd., Suwon-si (KR)

(72) Inventors: Tae Woong Um, Suwon-si (KR); Young Ju Kwon, Suwon-si (KR); Seung Won Yoon, Suwon-si (KR); Gu Ryung Jung, Suwon-si (KR); Seung Pyo Hong, Suwon-si (KR); Sung Hyup Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 95 days.

(21) Appl. No.: 19/002,823

(22) Filed: Dec. 27, 2024

(65) Prior Publication Data

US 2025/0226253 A1 Jul. 10, 2025

(30) Foreign Application Priority Data

Jan. 8, 2024 (KR) ........................ 10-2024-0002630

(51) Int. Cl.
*H10P 72/10* (2026.01)
*H10P 72/00* (2026.01)

(52) U.S. Cl.
CPC .......... *H10P 72/13* (2026.01); *H10P 72/0416* (2026.01)

(58) Field of Classification Search
CPC ...................................................... H10P 72/13
See application file for complete search history.

(56) References Cited

U.S. PATENT DOCUMENTS 6,616,774 B2 9/2003 Sonoda et al.
7,100,306 B2 9/2006 Jun et al.
2006/0216942 A1 9/2006 Kim et al.

FOREIGN PATENT DOCUMENTS

JP H10154675 A 6/1998
JP H11289000 A 10/1999

(Continued)

*Primary Examiner* — Jason Y Ko
(74) *Attorney, Agent, or Firm* — Muir Patent Law, PLLC

(57) ABSTRACT

A wafer cleaning apparatus and a semiconductor manufacturing process are provided. The wafer cleaning apparatus comprising a plate extending in a first direction, a connecting part which is directly connected to the plate, and extends in a second direction intersecting the first direction, a connecting serrated part which protrudes from the connecting part in the first direction, and is spaced apart from the plate in the second direction and a boundary connecting serrated part which protrudes from the connecting part in the first direction, and is directly connected to the plate, wherein the plate includes a guide part having a shape of a circle that is cut along an upper chord and a lower chord spaced apart in the first direction among chords of a circle, a holder connecting part extending from the upper chord in the first direction, and a support part extending from the lower chord in the first direction, the connecting serrated part includes a first connecting serrated part adjacent to the boundary connecting serrated part, and a second connecting serrated part adjacent to the first connecting serrated part, the first connecting serrated part is disposed between the boundary connecting serrated part and the second connecting serrated part, the connecting serrated part and the connecting part are directly connected to each other with the lower surface of the connecting serrated part as a boundary, and a distance of the lower surface of the connecting serrated part in the second direction is constant, a spaced distance in the second direction between a first point at which the boundary connecting (Continued)

serrated part and the first connecting serrated part are directly connected and a second point at which the first connecting serrated part and the second connecting serrated part are directly connected is defined as a distance of the lower surface of the first connecting serrated part in the second direction, and a distance of the lower surface of the first connecting serrated part in the second direction is equal to a spaced distance between the first point and the plate in the second direction.

20 Claims, 17 Drawing Sheets

(56) References Cited

FOREIGN PATENT DOCUMENTS

| | | | |
|---|---|---|---|
| JP | 2008-218885 | A | 9/2008 |
| KR | 10-2015-0068019 | A | 6/2015 |

WAFER CLEANING APPARATUS AND WAFER CLEANING SYSTEM INCLUDING THE SAME

CROSS-REFERENCE TO RELATED APPLICATION

This application claims priority from Korean Patent Application No. 10-2024-0002630 filed on Jan. 8, 2024 in the Korean Intellectual Property Office, the contents of which in its entirety are herein incorporated by reference.

BACKGROUND

The present invention relates to a wafer cleaning apparatus and a wafer cleaning system including the same, and more specifically, to a wafer cleaning apparatus that may prevent damage to wafer when cleaning the wafer, a wafer cleaning system including the same and a semiconductor device manufacturing method using the same.

Highly scaled and highly integrated semiconductor chips may feature narrow widths and be manufactured with fine pitches on a wafer. Such semiconductor chips are produced through various processes, and a wafer cleaning operation for removing impurities and foreign substances generated during the processes is essential.

On the other hand, the wafer should not be damaged during the wafer cleaning operation. Therefore, it is important to design a wafer cleaning apparatus that may prevent damage to the wafer, while cleaning the wafer.

SUMMARY

Aspects of the present invention provide a wafer cleaning apparatus that removes foreign substances remaining on the wafer surface, and prevents wafer damage due to a wafer cleaning operation.

Aspects of the present invention also provide a wafer cleaning system that may remove foreign substances remaining on a wafer surface, and may prevent wafer damage due to a wafer cleaning operation.

Aspects of the present invention provide a wafer cleaning apparatus comprising a plate extending in a first direction; a connecting part extending from the plate in a second direction intersecting the first direction; a boundary connecting serrated part protruding from the connecting part in the first direction, and directly connected to the plate; a plurality of connecting serrated parts protruding from the connecting part in the first direction and spaced apart from the plate in the second direction, the plurality of connecting serrated parts including a first connecting serrated part closest to the boundary connecting serrated part, and a second connecting serrated part adjacent to the first connecting serrated part; and a plurality of first accommodation spaces provided between two adjacent ones of the plurality of connecting serrated parts and a second accommodation space between the first connecting serrated part and the boundary connecting serrated part. The plurality of first accommodation spaces are configured to accommodate first wafers, and the second accommodation space is configured to accommodate a second wafer. The first connecting serrated part is disposed between the boundary connecting serrated part and the second connecting serrated part. The plurality of connecting serrated parts and the connecting part are directly connected to each other with a lower surface of the plurality of connecting serrated parts as a boundary, and upper surfaces of the plurality of connecting serrated parts have the same length in the second direction as each other. When the first wafers having the same sizes as each other are disposed in the plurality of first accommodation spaces and the second wafer having the same size as the first wafers is disposed in the second accommodation space, a distance in the second direction between the second wafer and an inner wall of the plate is the same as a distance in the second direction between the second wafer and an adjacent first wafer.

Aspects of the present invention also provide a wafer cleaning apparatus comprising a plate extending in a first direction; a connecting part extending from the plate in a second direction intersecting the first direction; a shelf part extending from the plate in the second direction; a boundary connecting serrated part protruding from the connecting part in the first direction, and extending from the plate; a plurality of connecting serrated parts protruding from the connecting part in the first direction and spaced apart from the plate in the second direction, the plurality of connecting serrated parts including a first connecting serrated part closest to the boundary connecting serrated part, and a second connecting serrated part adjacent to the first connecting serrated part; a boundary shelf serrated part protruding from the shelf part in the first direction, and directly connected to the plate; a plurality of shelf serrated parts protruding from the shelf part in the first direction and spaced apart from the plate in the second direction, the plurality of shelf serrated parts including a first shelf serrated part closest to the boundary shelf serrated part, and a second shelf serrated part adjacent to the first shelf serrated part; a plurality of first accommodation spaces provided between two adjacent ones of the plurality of connecting serrated parts and a second accommodation space between the first connecting serrated part and the boundary connecting serrated part; and a plurality of third accommodation spaces provided between two adjacent ones of the plurality of shelf serrated parts and a fourth accommodation space between the first shelf serrated part and the boundary shelf serrated part. the plurality of first accommodation spaces are configured to accommodate first wafers, and the second accommodation space is configured to accommodate a second wafer, The plurality of third accommodation spaces are configured to accommodate the first wafers, and the fourth accommodation space is configured to accommodate the second wafer. The first connecting serrated part is disposed between the boundary connecting serrated part and the second connecting serrated part. The plurality of connecting serrated parts and the connecting part are directly connected to each other with a lower surface of the plurality of connecting serrated parts as a boundary, and upper surfaces of the plurality of connecting serrated parts have the same length in the second direction as each other. A distance in the second direction between the second wafer and of an inner wall of the plate is the same as a distance in the second direction between the second wafer and adjacent one of second wafers. The first shelf serrated part is disposed between the boundary shelf serrated part and the second shelf serrated part. The plurality of shelf serrated parts and the shelf part are directly connected to each other with a lower surface of the plurality of shelf serrated parts as a boundary, and a distance of upper surfaces of the plurality of shelf serrated parts have the same length in the second direction as each other. The connecting part and the shelf part are spaced apart from each other in a third direction intersecting the first direction and the second direction.

Aspects of the present invention also provide a wafer cleaning system comprising a cleaning container; a heating part formed on at least one surface of the cleaning container; and a wafer cleaning apparatus inserted into the cleaning container. The wafer cleaning apparatus includes: a plate extending in a first direction; a connecting part extending from the plate in a second direction intersecting the first direction; a boundary connecting serrated part protruding from the connecting part in the first direction, and directly connected to the plate; a plurality of connecting serrated parts protruding from the connecting part in the first direction and spaced apart from the plate in the second direction, the plurality of connecting serrated parts including a first connecting serrated part closest to the boundary connecting serrated part, and a second connecting serrated part adjacent to the first connecting serrated part; and a plurality of first accommodation spaces provided between two adjacent ones of the plurality of connecting serrated parts and a second accommodation space between the first connecting serrated part and the boundary connecting serrated part. The plurality of first accommodation spaces are configured to accommodate first wafers, and the second accommodation space is configured to accommodate a second wafer. The first connecting serrated part is disposed between the boundary connecting serrated part and the second connecting serrated part. The plurality of connecting serrated parts and the connecting part are directly connected to each other with a lower surface of the plurality of connecting serrated parts as a boundary, and upper surfaces of the plurality of connecting serrated parts have the same length in the second direction as each other. When the first wafers having the same sizes as each other are disposed in the plurality of first accommodation spaces and the second wafer having the same size as the first wafers is disposed in the second accommodation space, a distance in the second direction between the second wafer and an inner wall of the plate is the same as a distance in the second direction between the second wafer and an adjacent first wafers.

According to example embodiments, a method for manufacturing a semiconductor device comprising accommodating wafers in a wafer cleaning rack; providing a cleaning container filled with a cleaning solution; placing the wafers accommodated in the wafer cleaning rack in the cleaning container; and performing a cleaning process of the wafers accommodated the wafer cleaning rack by using the cleaning container. The wafer cleaning rack comprises a plate extending in a first direction; a connection siding beam extending from the plate in a second direction intersecting the first direction; an outermost siding protrusion protruding from the connection siding beam in the first direction, and directly connected to the plate; a plurality of inner siding protrusions protruding from the connection siding beam in the first direction and spaced apart from the plate in the second direction, the plurality of inner siding protrusions including a first inner siding protrusion closest to the outermost siding protrusion, and a second inner siding protrusion adjacent to the first inner siding protrusion; and a plurality of first accommodation spaces provided between two adjacent ones of the plurality of inner siding protrusions and a second accommodation space between the first inner siding protrusion and the outermost siding protrusion. The plurality of first accommodation spaces are configured to accommodate first wafers, and the second accommodation space is configured to accommodate a second wafer. The first inner siding protrusion is disposed between the outermost siding protrusion and the second inner siding protrusion. The plurality of inner siding protrusions and the connection siding beam are directly connected to each other with a lower surface of the plurality of inner siding protrusions as a boundary, and upper surfaces of the plurality of inner siding protrusions have the same length in the second direction as each other. When the first wafers having the same sizes as each other are disposed in the plurality of first accommodation spaces and the second wafer having the same size as the first wafers is disposed in the second accommodation space, a distance in the second direction between the second wafer and an inner wall of the plate is the same as a distance in the second direction between the second wafer and an adjacent first wafers.

According to example embodiments, a method for manufacturing a semiconductor device comprising accommodating wafers in a wafer cleaning rack; providing a cleaning container filled with a cleaning solution; placing the wafers accommodated in the wafer cleaning rack in the cleaning container; and performing a cleaning process of the wafers accommodated the wafer cleaning rack by using the cleaning container. The wafer cleaning rack comprises a plate extending in a first direction; a connection siding beam extending from the plate in a second direction intersecting the first direction; a bottom connection support beam extending from the plate in the second direction; an outermost siding protrusion protruding from the connection siding beam in the first direction, and directly connected to the plate; a plurality of inner siding protrusions protruding from the connection siding beam in the first direction and spaced apart from the plate in the second direction, the plurality of inner siding protrusions including a first inner siding protrusion closest to the outermost siding protrusion, and a second inner siding protrusion adjacent to the first inner siding protrusion; an outermost bottom protrusion protruding from the bottom connection support beam in the first direction, and directly connected to the plate; a plurality of inner bottom protrusions protruding from the bottom connection support beam in the first direction and spaced apart from the plate in the second direction, the plurality of inner bottom protrusions including a first inner bottom protrusion closest to the outermost bottom protrusion, and a second inner bottom protrusion adjacent to the first inner bottom protrusion; a plurality of first accommodation spaces provided between two adjacent ones of the plurality of inner siding protrusions and a second accommodation space between the first inner siding protrusion and the outermost siding protrusion; and a plurality of third accommodation spaces provided between two adjacent ones of the plurality of inner bottom protrusions and a fourth accommodation space between the first inner bottom protrusion and the outermost bottom protrusion. The plurality of first accommodation spaces are configured to accommodate first wafers, and the second accommodation space is configured to accommodate a second wafer. The plurality of third accommodation spaces are configured to accommodate the first wafers, and the fourth accommodation space is configured to accommodate the second wafer. The first inner siding protrusion is disposed between the outermost siding protrusion and the second inner siding protrusion. The plurality of inner siding protrusions and the connection siding beam are directly connected to each other with a lower surface of the plurality of inner siding protrusions as a boundary, and upper surfaces of the plurality of inner siding protrusions have the same length in the second direction as each other. When the first wafers having the same sizes as each other are disposed in the plurality of first accommodation spaces and the second wafer having the same size as the first wafers is disposed in the second accommodation space, a distance in the second direction between the second wafer and an inner wall of the plate is the same as a distance in the second direction between the second wafer and an adjacent first wafers. The first inner bottom protrusion is disposed between the outermost bottom protrusion and the second inner bottom protrusion. The plurality of inner bottom protrusions and the bottom connection support beam are directly connected to each other with a lower surface of the plurality of inner bottom protrusions as a boundary, and a distance of upper surfaces of the plurality of inner bottom protrusions have the same length in the second direction as each other. The connection siding beam and the bottom connection support beam are spaced apart from each other in a third direction intersecting the first direction and the second direction.

According to example embodiments, a method for manufacturing a semiconductor device comprising accommodating wafers in a wafer cleaning rack; providing a cleaning container filled with a cleaning solution; placing the wafers accommodated in the wafer cleaning rack in the cleaning container; and performing a cleaning process of the wafers accommodated the wafer cleaning rack by using the cleaning container. The wafer cleaning rack comprises a plate extending in a first direction; a connection siding beam extending from the plate in a second direction intersecting the first direction; an outermost siding protrusion protruding from the connection siding beam in the first direction, and directly connected to the plate; a plurality of inner siding protrusions protruding from the connection siding beam in the first direction and spaced apart from the plate in the second direction, the plurality of inner siding protrusions including a first inner siding protrusion closest to the outermost siding protrusion, and a second inner siding protrusion adjacent to the first inner siding protrusion; and a plurality of first accommodation spaces provided between two adjacent ones of the plurality of inner siding protrusions and a second accommodation space between the first inner siding protrusion and the outermost siding protrusion. The plurality of first accommodation spaces are configured to accommodate first wafers, and the second accommodation space is configured to accommodate a second wafer. The first inner siding protrusion is disposed between the outermost siding protrusion and the second inner siding protrusion. Upper surfaces of the plurality of inner siding protrusions have the same length in the second direction as each other. A ratio a first distance to a second distance is greater than 80%, the first distance is a distance in the second direction between the second wafer and adjacent one of the second wafers, and the second distance is a distance in the second direction between the second wafer and an inner wall of the plate.

Aspects of the present invention also provide a wafer cleaning rack comprising a first end plate and a second end plate facing each other such that a first surface of the first end plate faces a first surface of the second end plate; and a first connection structure extending in a first direction and extending between and connecting the first end plate and the second end plate, and including a first body portion and a plurality of first protruding portions protruding from a top of the first body portion. The plurality of first protruding portions are adjacent to each other and have first wafer accommodation grooves therebeween, each first wafer accommodation groove having a bottommost point when viewed from a second direction perpendicular to the first direction. Bottommost points of adjacent first wafer accommodation grooves are separated by a first distance. A bottommost point of a first outermost wafer accommodation groove is separated from an extension line of the first surface of the first end plate by a second distance that is the same as or smaller than the first distance, and the first outermost wafer accommodation groove is closest one of the first wafer accommodation grooves to the first end plate.

Aspects of the present invention also provide a wafer cleaning rack comprising a first end plate and a second end plate facing each other such that a first surface of the first end plate faces a first surface of the second end plate; and a first connection structure extending in a first direction and extending between and connecting the first end plate and the second end plate, and including a first body portion and a plurality of first protruding portions protruding from a top of the first body portion. The plurality of first protruding portions are adjacent to each other and have first wafer accommodation grooves therebeween. When wafers having the same sizes as each other are disposed in the first wafer accommodation grooves, the first wafer accommodation grooves are configured to accommodating the wafers such that adjacent wafers are separated by a first distance. When the wafers are disposed in the first wafer accommodation grooves, a first outermost accommodation groove of the first connection structure is configured to be separated from an extension line of the first surface of the first end plate by a second distance such that an outermost wafer is spaced apart from the first surface of the first end plate by the first distance, and the outermost wafer is closest one of the wafers to the first end plate.

However, aspects of the present invention are not restricted to the ones set forth herein. The above and other aspects of the present invention will become more apparent to one of ordinary skill in the art to which the present invention pertains by referencing the detailed description of the present invention given below.

BRIEF DESCRIPTION OF DRAWINGS

The above and other aspects and features of the present invention will become more apparent by describing in detail illustrative embodiments thereof with reference to the attached drawings, in which.

DETAILED DESCRIPTION OF THE EMBODIMENTS

It should be noted that items described in the singular herein, may be provided in plural, as can be seen in the various figures from the context in which they are described, and such description should be considered applicable to each of the plural, unless context indicates otherwise.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Figure 1:
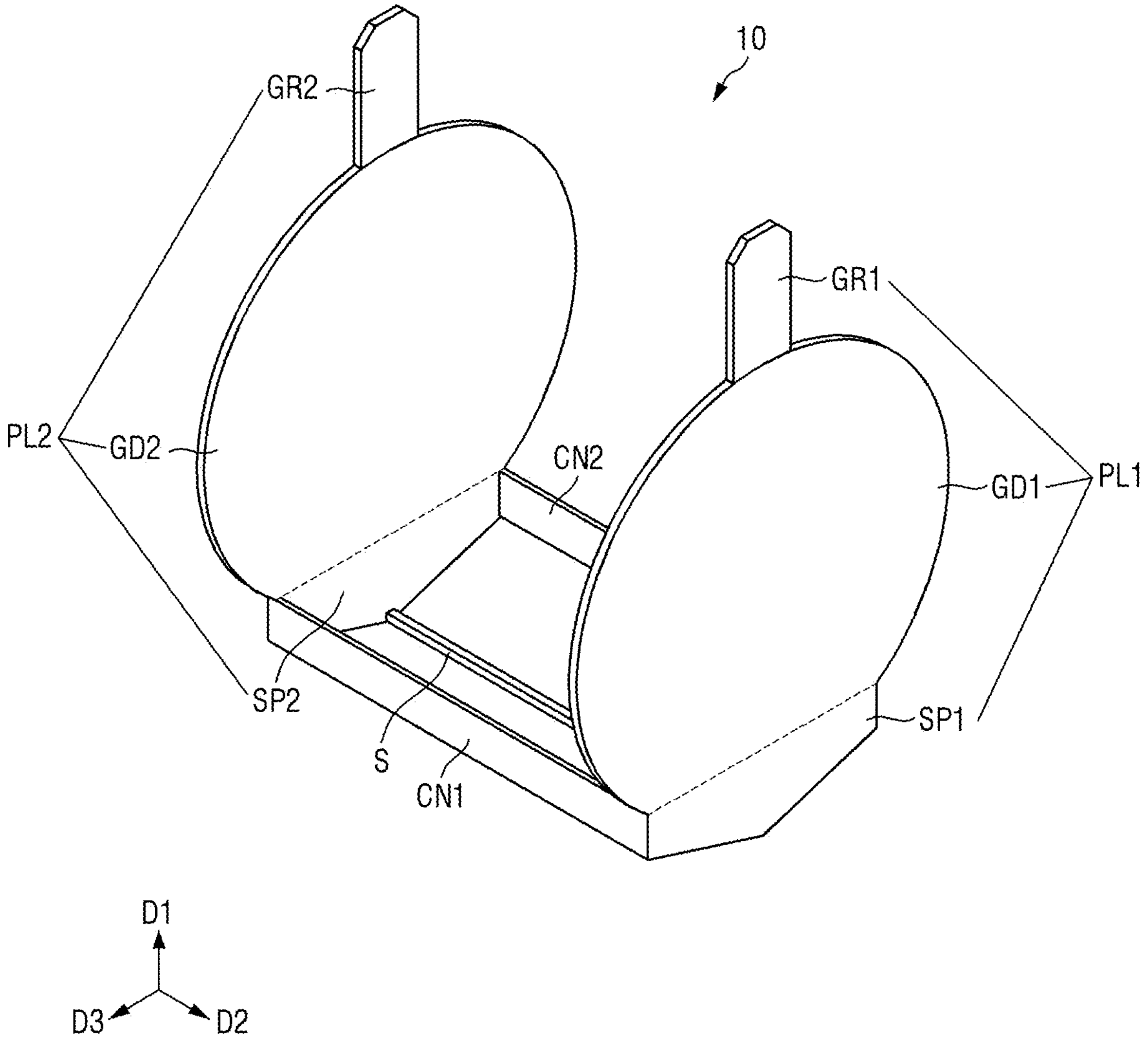
FIG. 1 is a perspective view for explaining a wafer cleaning apparatus according to some embodiments of the present invention.
Figure 2:
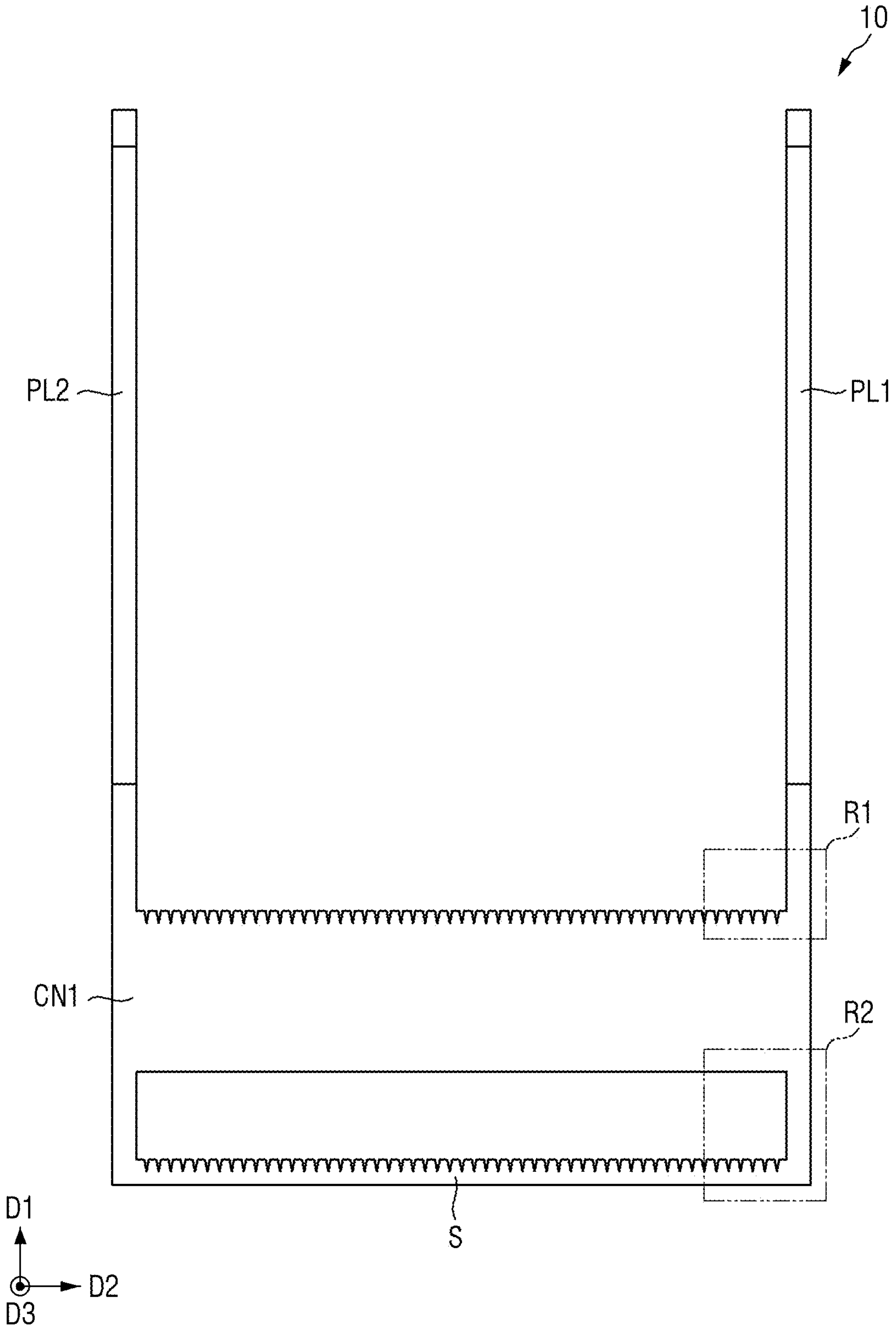
FIG. 2 is a front view of the wafer cleaning apparatus according to some embodiments of the present invention.
Figure 3:
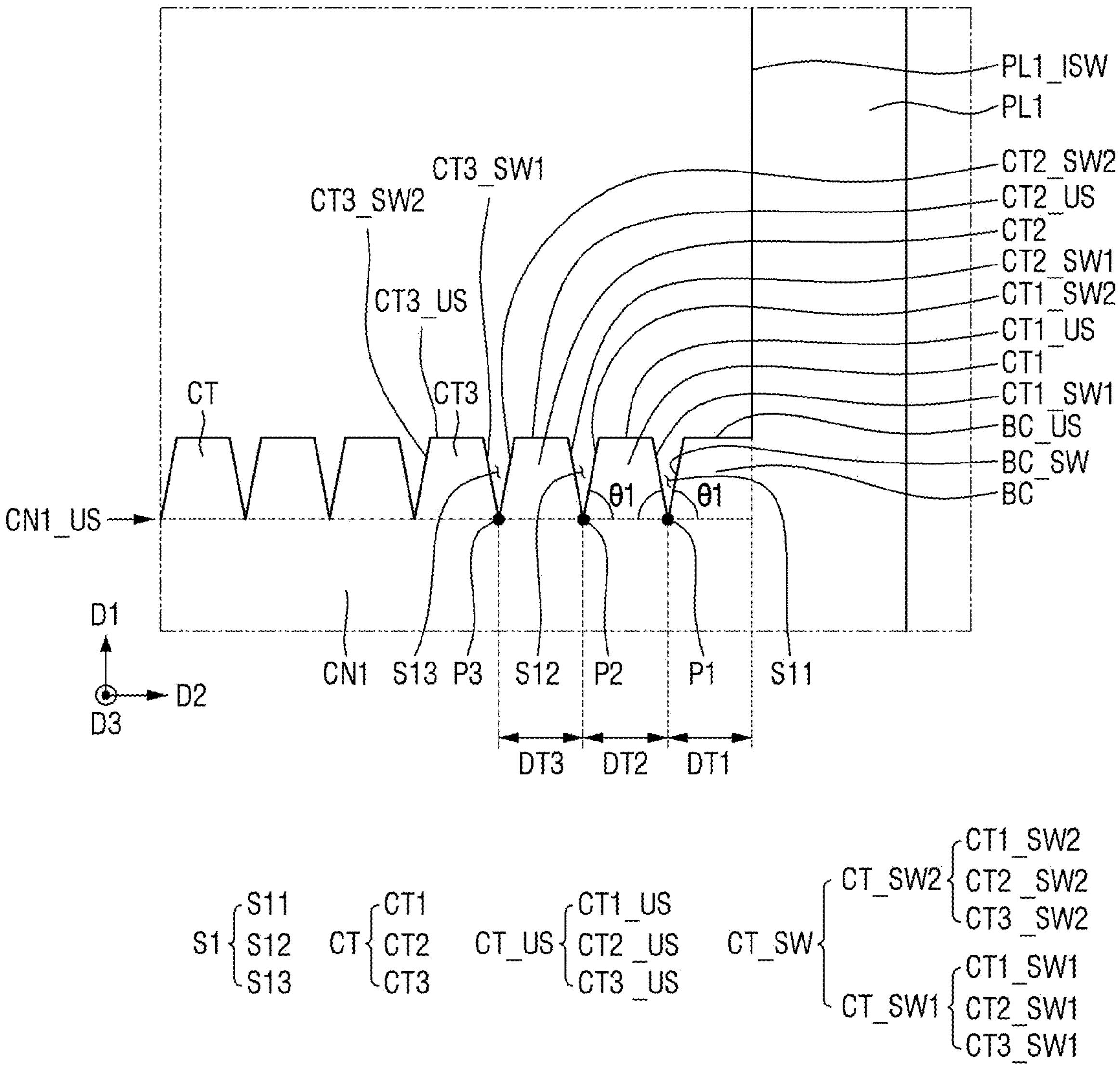
FIG. 3 is an enlarged view of a region R1 of FIG. 2.
Figure 4:
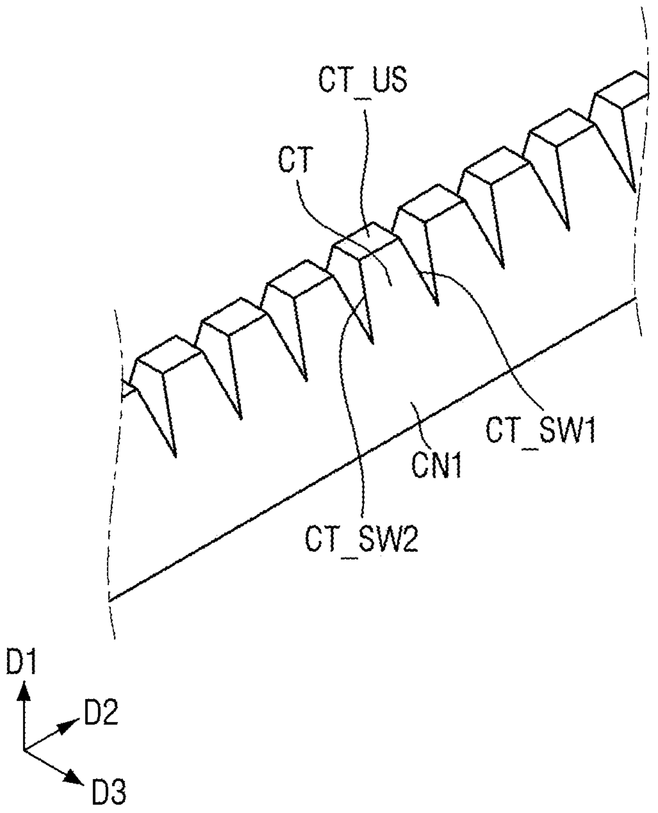
FIG. 4 is a perspective view for explaining a first connecting part of the wafer cleaning apparatus according to some embodiments of the present invention.
Figure 5:
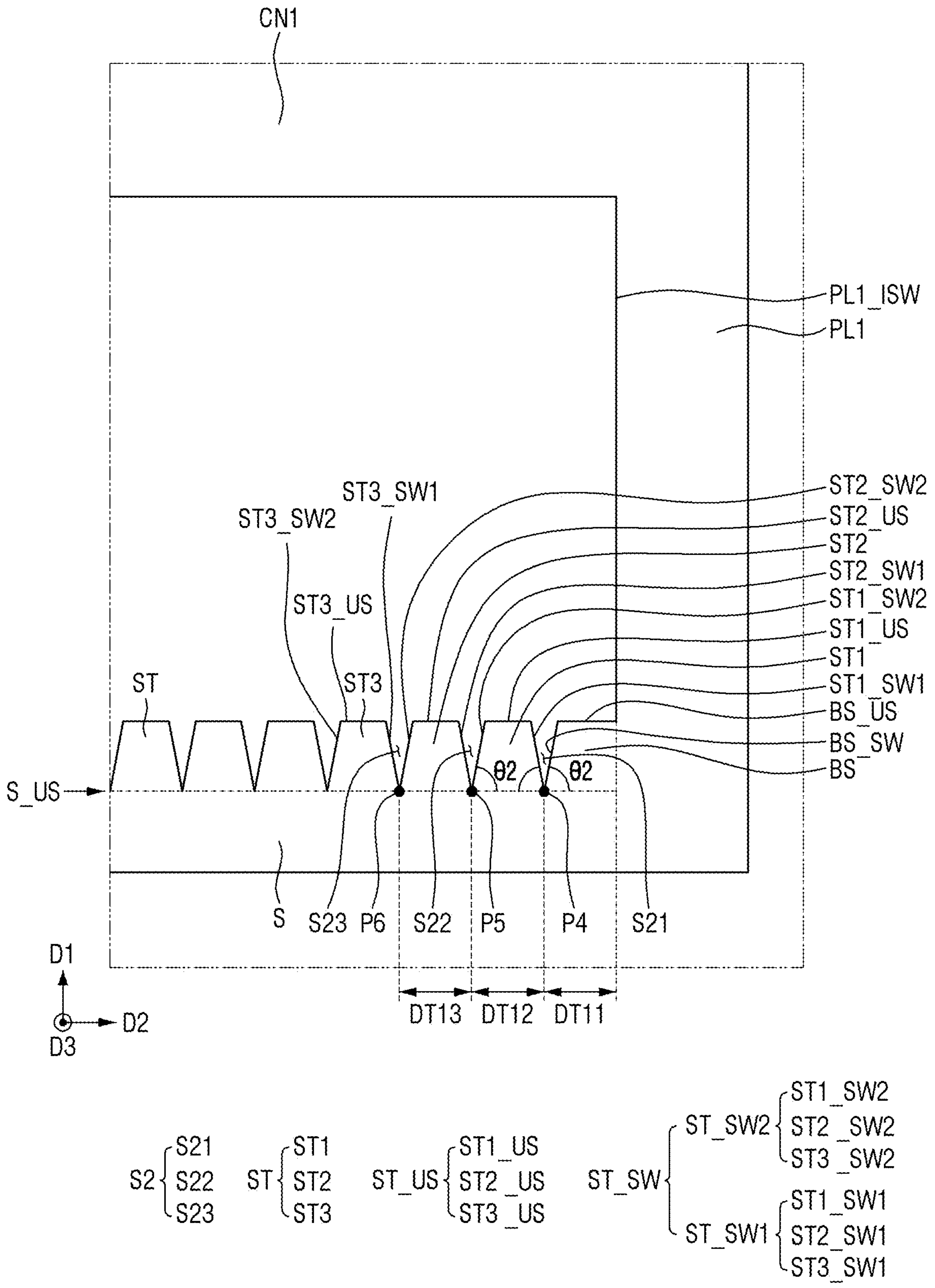
FIG. 5 is an enlarged view of a region R2 of FIG. 2.
Figure 6:
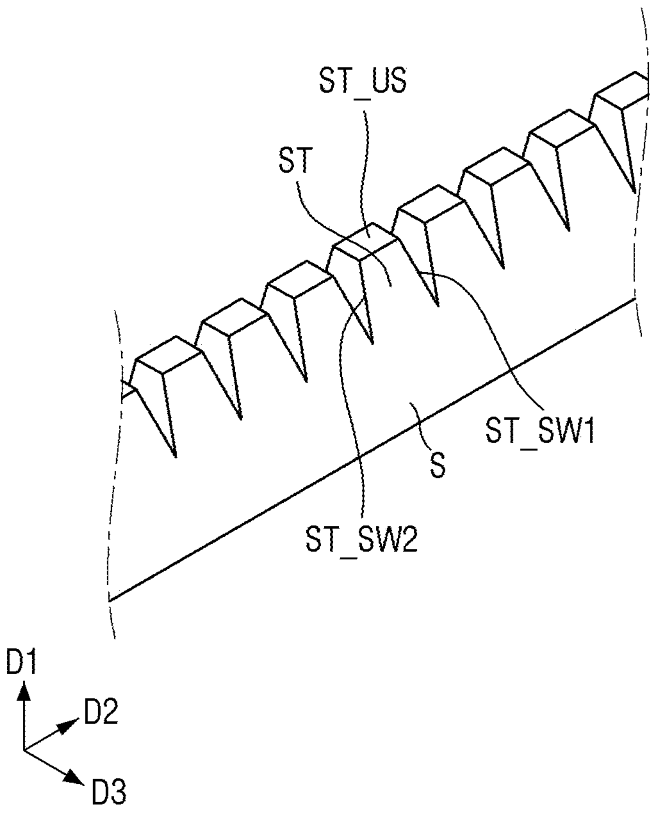
FIG. 6 is a perspective view for explaining a shelf part of the wafer cleaning apparatus according to some embodiments of the present invention.
Figure 7:
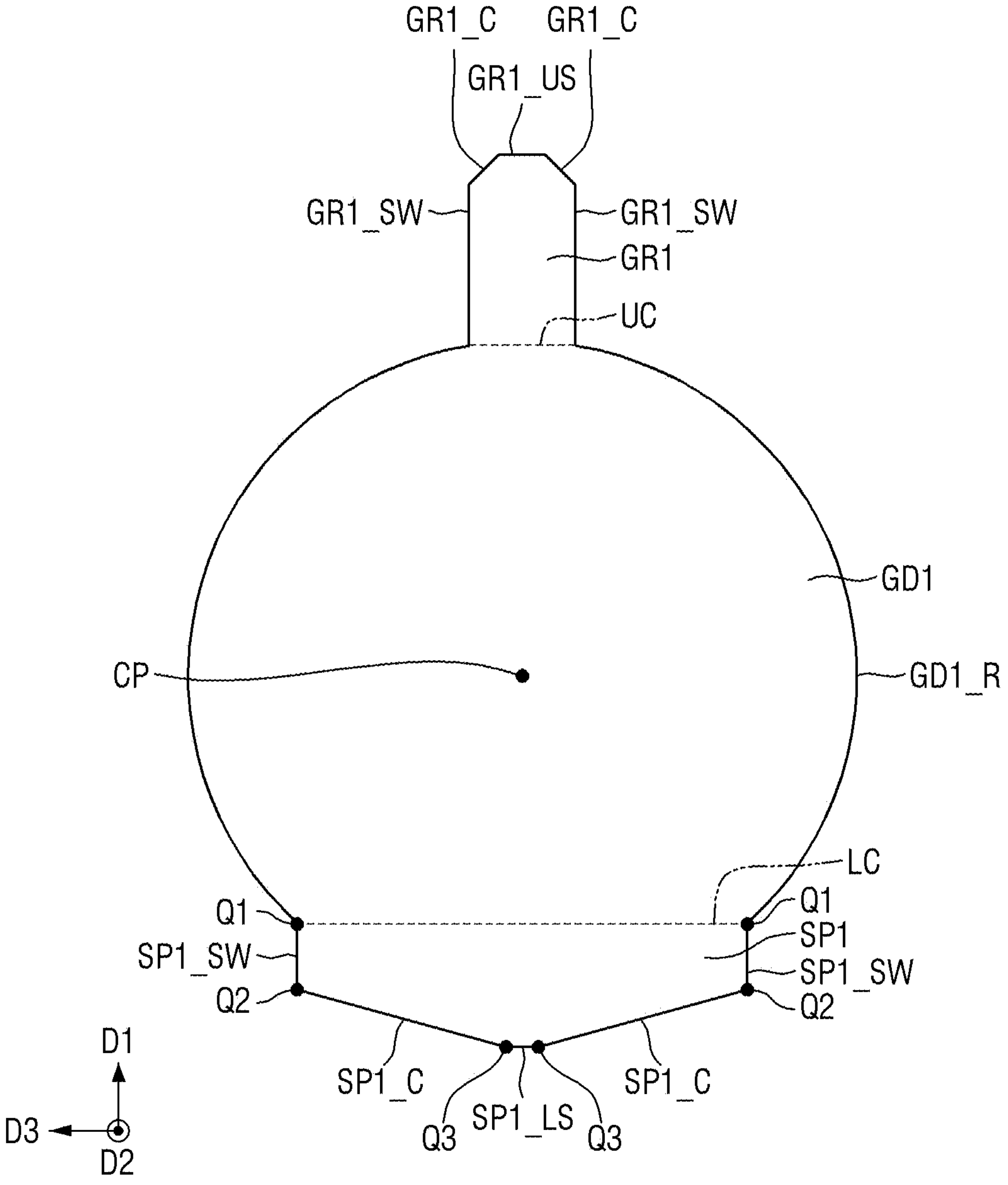
FIG. 7 is a side view of the wafer cleaning apparatus according to some embodiments of the present invention.

FIG. 1 is a perspective view for explaining a wafer cleaning apparatus according to some embodiments of the present invention. FIG. 2 is a front view of the wafer cleaning apparatus according to some embodiments of the present invention. FIG. 3 is an enlarged view of a region R1 of FIG. 2. FIG. 4 is a perspective view for explaining a first connecting part of the wafer cleaning apparatus according to some embodiments of the present invention. FIG. 5 is an enlarged view of a region R2 of FIG. 2. FIG. 6 is a perspective view for explaining a shelf part of the wafer cleaning apparatus according to some embodiments of the present invention. FIG. 7 is a side view of the wafer cleaning apparatus according to some embodiments of the present invention.

Referring to FIGS. 1 to 7, a wafer cleaning apparatus 10 may include a first plate PL1, a second plate PL2, a first connecting part CN1, a second connecting part CN2, and a shelf part S. Although the first plate PL1, the second plate PL2, the first connecting part CN1, the second connecting part CN2, and the shelf part S are shown separately for convenience of explanation, the first plate PL1, the second plate PL2, the first connecting part CN1, the second connecting part CN2, and the shelf part S may be integrally formed. Each of the first connecting part CN1 and second connecting part CN2 may have a plate or bar shape, and each may be a connection structure such as a connection plate, connection bar, or connection panel, or a support plate, support bar, or support panel. The shelf part S may have a rod or bar shape, and may be a support bar or support rod. The first plate PL1, second plate PL2, first connecting part CN1, second connecting part CN2, and shelf part S may be formed of a rigid material, such as quartz. The wafer cleaning apparatus 10 may be a wafer holding cartridge or rack, formed as a wafer holding frame. It may be described as a wafer cleaning rack. For example the first plate PL1 and second plate PL2 may be vertically-extending end sides of the cartridge, rack, or frame, and each of the first connecting part CN1, the second connecting part CN2, and the shelf part S may be horizontally-extending support beams or connection beams of the cartridge, rack, or frame. The first connecting part CN1 and the second connecting part CN2 may be a connection siding beam or panel of the frame, and the shelf part S may be a bottom connection support beam. The first plate PL1 and second plate PL2 may be described as the first end plate PL1 and second plate end PL2, respectively.

The first plate PL1 may extend in a first direction D1. The first plate PL1 may have a shape of a hand mirror that is upside down.

The first plate PL1 may include a first holder connecting part GR1, a first guide part GD1, and a first support part SP1. Although the first holder connecting part GR1, the first guide part GD1, and the first support part SP1 are shown distinguished from each other for convenience of explanation, the first holder connecting part GR1, the first guide part GD1, and the first support part SP1 may be integrally formed.

The first holder connecting part GR1, which may be a handle, may be directly connected to the first guide part GD1 with the upper chord UC as a boundary. The first support part SP1, which may connect to a support beam or support bar of the first plate PL1, may be directly connected to the first guide part GD1 with a lower chord LC as a boundary. For example, the first holder connecting part GR1 and the first guide part GD1 may be directly connected to each other at the upper chord (also referred to as upper boundary) UC. The first support part SP1 and the first guide part GD1 may be directly connected to each other at the lower chord (i.e., a lower boundary) LC.

The first guide part GD1 may have an incomplete circular shape. More specifically, the first guide part GD1 may have a shape of a circle cut along at least one straight line. For example, the first guide part GD1 may have a shape of a circle cut along two straight lines, one of which may correspond to the upper boundary UC extending in a third direction D3, and the other of which may correspond to the lower boundary LC extending in the third direction D3. For example, the first guide part GD1 may have a shape in which one side of the upper chord UC and one side of the lower chord LC are directly connected by a curved line, and the other side of the upper chord UC and the other side of the lower chord LC are directly connected by another curved line. For example, the upper and lower parts (i.e., boundaries) of the first guide part GD1 may have a flat shape respectively. The upper and lower parts of the first guide part GD1 may extend in the third direction D3. A side wall (or also referred to as a peripheral edge) GD1_R of the first guide part GD1 may have a round shape.

Terms such as "flat," "same," "equal," "identical," "symmetrical," etc. as used herein when referring to features such as orientation, layout, location, shapes, sizes, compositions, amounts, or other measures do not necessarily mean an exactly identical feature but is intended to encompass nearly identical features including typical variations that may occur resulting from conventional manufacturing processes. The term "substantially" may be used herein to emphasize this meaning.

The first holder connecting part GR1, which may be a handle, may have a hexagonal shape. For example, the first holder connecting part GR1 may have two side walls GR1_SW that are spaced apart from each other in the third direction D3, an upper surface GR1_US extending in the third direction D3, and two inclined surfaces GR1_C. Each of the two inclined surfaces GR1_C may be directly connected to a corresponding one of the two side walls GR1_SW. Both of the two inclined surfaces GR1_C may be directly connected to the upper surface GR1_US. The two side walls GR1_SW, the two inclined surfaces GR1_C, the upper surface GR1_US and the upper chord UC may form a hexagonal shape of the first holder connecting part GR1.

The first holder connecting part GR1 may be symmetrical with respect to a plane that passes through a center CP of the first guide part GD1 and is perpendicular to the third direction D3. Although the first holder connecting part GR1 is only shown as being symmetrical with respect to the plane that passes through the center CP of the first guide part GD1 and is perpendicular to the third direction D3, the shape of the first holder connecting part GR1 is not limited thereto.

The inclined surface GR1_C of the first holder connecting part GR1 may be a flat surface, but the invention is not limited thereto. For example, the inclined surface GR1_C of the first holder connecting part GR1 may be a curved surface that connects the upper surface GR1_US of the first holder connecting part GR1 and the side wall GR1_SW of the first holder connecting part GR1.

The first support part SP1 may have a hexagonal shape. More specifically, the first support part SP1 may include two side walls SP1_SW spaced apart in the third direction D3, a lower surface (also referred to a lower edge) SP1_LS extending in the third direction D3, and two inclined surfaces (also referred to inclined edges) SP1_C connecting the respective side walls SP1_SW of the first support part SP1 and the lower surface SP1_LS. For example, the two side walls SP1_SW, the two inclined surfaces SP1_C, the lower surface SP1_LS, and the lower chord LC may form a hexagonal shape of the first support part SP1.

A point at which the side walls SP1_SW and the lower chord LC join may be designated by Q1. A point, at which the inclined surface SP1_C and the side walls SP1_SW of the first support part SP1 join, may be designated by Q2. A point, at which the lower surface SP1_LS and the inclined surface SP1_C join, may be designated by Q3. Vertices of the hexagonal structure of the first support part SP1 may include the point Q1, the point Q2, and the point Q3.

The first support part SP1 may be symmetrical to a plane that passes through the center CP of the first guide part GD1 and is perpendicular to the third direction D3. Although only the first support part SP1 is shown as being symmetrical to a plane that passes through the center CP of the first guide part GD1 and is perpendicular to the third direction D3. However, the shape of the first support part SP1 of the invention is not limited thereto.

Although the inclined surface SP1_C of the first support part SP1 may be a flat surface, the invention is not limited thereto. For example, the inclined surface SP1_C of the first support part SP1 may be a curved surface that connects the lower surface SP1_LS of the first support part SP1 and the side walls SP1_SW of the first support part SP1.

The first connecting part CN1, the second connecting part CN2, and the shelf part S may extend (e.g., may extend lengthwise) from the first support part SP1.

The second plate PL2 may extend in the first direction D1. The second plate PL2 may have a shape of a hand mirror that is upside down The second plate PL2 may include a second holder connecting part GR2, a second guide part GD2, and a second support part SP2. Although the second holder connecting part GR2, the second guide part GD2, and the second support part SP2 are distinguished for convenience of explanation, the second holder connecting part GR2, the second guide part GD2, and the second support part SP2 may be formed integrally.

The description of the second plate PL2 may be the same or substantially the same as the description of the first plate PL1. For example, the description of the first guide part GD1 may be the same or substantially the same as the description of the second guide part GD2, the description of the second holder connecting part GR2 may be the same or substantially the same as the first holder connecting part GR1, and the description of the second support part SP2 may be the same or substantially the same as the description of the first support part SP1.

The first and second plates PL1 and PL2 may be configured to be symmetrical to each other with respect to a plane perpendicular to a second direction D2. Accordingly, the first and second plates PL1 and PL2 may have a different configuration from each other in view of the direction of their connection to the first connecting part CN1, the second connecting part CN2, and the shelf part S.

Further, although the shapes of the first plate PL1 and the second plate PL2 are only shown as being the same as or substantially identical to each other, the shapes of the first plate PL1 and the second plate PL2 may be modified as appropriate. For example, the first and second guide part GD1 and GD2 may have a different configuration from each other so long as they both completely overlap with the same surfaces of a plurality of wafers (shown in FIG. 8) when viewed in the second direction D2. For example, the combined guide part GD1 and first support part SP1 may completely overlap with the entire surfaces of each wafer when viewed in the second direction D2. In one embodiment, each of the first plate PL1 and second plate PL2 have a shape with an outer boundary that completely surrounds the wafers loaded onto the wafer cleaning rack when viewed from the second direction D2. As can be seen in various embodiments, the first plate PL1 and second plate PL2 may completely cover the wafers loaded onto the wafer cleaning rack (e.g., may cover the outermost surfaces of the outermost wafers loaded onto the wafer cleaning rack) when viewed from the second direction D2.

The first plate PL1 and the second plate PL2 may be spaced apart from each other in the second direction D2, which intersects the first direction D1 and the third direction D3. For example, the first holder connecting part GR1 and the second holder connecting part GR2 may be spaced apart from each other in the second direction D2, the first guide part GD1 and the second guide part GD2 may be spaced apart from each other in the second direction D2, and the first support part SP1 and the second support part SP2 may be spaced apart from each other in the second direction D2.

The first connecting part CN1 may extend from the first plate PL1 or the second plate PL2. More specifically, the first connecting part CN1 may extend from the first support part SP1 or the second support part SP2.

The first connecting part CN1 may be directly connected to the first plate PL1 or the second plate PL2. More specifically, the first connecting part CN1 may be directly connected to the first support part SP1 or the second support part SP2.

The first connecting part CN1 may be disposed between the first plate PL1 and the second plate PL2.

The first connecting part CN1 may extend in the second direction D2.

The first connecting part CN1 may have, but not limited to, a rectangular parallelepiped shape. For example, the first connecting part CN1 may have a flat, bar-shape. In other embodiments, the first connecting part CN1 may have a cylindrical shape extending in the second direction D2.

A first boundary connecting serrated part BC and a plurality of connecting serrated parts CT may protrude from the first connecting part CN1 (e.g., they may be protruding portions, such as vertically-extending protrusions, of the first connecting part CN1, protruding vertically above a solid body portion of the first connecting part CN1). For example, the plurality of connecting serrated parts (also referred to as inner siding protrusions) CT may include first to third connecting serrated parts CT1 to CT3.

The first boundary connecting serrated part BC (e.g., a first, outermost, vertically-extending protrusion, also described as a boundary-connected protrusion or frame-integrated protrusion) may be disposed at a portion in which the first connecting part CN1 and the first plate PL1 are directly connected. The first boundary connecting serrated part (also referred to as an outermost siding protrusion) BC may protrude from the first connecting part CN1 in the first direction D1. The first boundary connecting serrated part BC may protrude from the first plate PL1 in the second direction D2. The first boundary connecting serrated part BC and the plurality of connecting serrated parts CT may be described collectively as siding protrusions.

Although not shown, a second boundary connecting serrated part (e.g., a second, outermost, vertically-extending protrusion, also described as a boundary-connected protrusion or frame-integrated protrusion) may also be disposed at a portion in which the first connecting part CN1 and the second plate PL2 are directly connected. In this case, the second boundary connecting serrated part may protrude from the second plate PL2 in the second direction D2. In this manner, both the first boundary connecting serrated part BC and a second boundary connecting serrated part have a top surface that directly connects to the respective first and second plates PL1 and PL2, without having a recess therebetween.

The first connecting part CN1, the plurality of connecting serrated parts CT (e.g., inner vertically-extending protrusions) and the first and second boundary connecting serrated parts may be formed integrally. The description of the second boundary connecting serrated part may be substantially the same as the description of the first boundary connecting serrated part BC.

The first boundary connecting serrated part BC may include an upper surface BC_US of the first boundary connecting serrated part BC and a side wall BC_SW of the first boundary connecting serrated part BC.

The upper surface BC_US of the first boundary connecting serrated part BC may extend in the second direction D2.

The side wall BC_SW of the first boundary connecting serrated part BC may form a first angle θ1 with an upper surface (also referred to as a boundary between the first connecting part and the plurality of connecting serrated parts) CN1_US of the first connecting part CN1.

The upper surface BC_US (e.g., uppermost surface) of the first boundary connecting serrated part BC and the side wall BC_SW of the first boundary connecting serrated part BC may be directly connected to each other.

The connecting serrated part CT may be disposed on the top of the first connecting part CN1. The connecting serrated part CT may protrude from the first connecting part CN1 in the first direction D1.

Each of the connecting serrated parts CT may include an upper surface CT_US of the connecting serrated part CT and two side walls CT_SW of the connecting serrated part CT. For example, the first connecting serrated part CT1 may include an upper surface CT1_US of the first connecting serrated part CT1, and two side walls CT1_SW1 and CT1_SW2 of the first connecting serrated part CT1. The upper surfaces CT_US may have the same length in the second direction as each other.

The upper surface CT_US of the connecting serrated parts CT may extend in the second direction D2. For example, the upper surface CT1_US of the first connecting serrated part CT1 may extend in the second direction D2.

The side walls CT_SW of the connecting serrated part CT may form a first angle θ1 with the upper surface CN1_US of the first connecting part CN1. For example, the side wall CT1_SW1 or CT1 SW2 of the first connecting serrated part CT1 may form the first angle θ1 with the upper surface CN1_US of the first connecting part CN1. The side walls CT_SW of the connecting serrated part CT may also form the first angle θ1 with an upper surface CT_US of the plurality of connecting serrated parts CT.

Each of the side walls CT_SW of the connecting serrated part CT and the upper surface CT_US of the connecting serrated part CT may be directly connected to each other. For example, the side wall CT1_SW1 or CT1_SW2 of the first connecting serrated part CT1 and the upper surface CT1_US of the first connecting serrated part CT1 may be directly connected to each other.

The upper surface BC_US of the first boundary connecting serrated part BC and the upper surface CT_US of the connecting serrated part CT may be disposed on the same plane as each other. For example, the upper surface BC_US of the first boundary connecting serrated part BC, the upper surface CT1_US of the first connecting serrated part CT1, the upper surface CT2_US of the second connecting serrated part CT2, and the upper surface CT3_US of the third connecting serrated part CT3 may be disposed on the same plane as each other.

From the viewpoint of a front view as in FIGS. 2 and 3, the connecting serrated part CT may have a trapezoidal shape in which a length of the lower surface of the connecting serrated part CT in the second direction is longer than a length of the upper surface CT_US of the connecting serrated part CT in the second direction D2. For example, the length from a point P1 to a point P2 may be longer than the length of the upper surface CT1_US of the first connecting serrated part CT1 in the second direction D2. As another example, the length from a point P2 to a point P3 may be longer than the length of the upper surface CT2_US of the second connecting serrated part CT2 in the second direction D2.

From the viewpoint of a front view such as in FIGS. 2 and 3, the side wall BC_SW of the first boundary connecting serrated part BC and the side wall of the connecting serrated part CT may join together. For example, the side wall BC_SW of the first boundary connecting serrated part BC and the side wall of the first connecting serrated part CT1 may join at the point P1.

From the viewpoint of a front view as in FIGS. 2 and 3, adjacent connecting serrated parts CT may join together. For example, adjacent two side walls CT_SW of the connecting serrated part CT may join at a point. For example, the side wall CT1_SW2 of the first connecting serrated part CT1 and the side wall CT2_SW1 of the second connecting serrated part CT2 may join at the point P2. As another example, the side wall CT2_SW2 of the second connecting serrated part CT2 and the side wall CT3_SW1 of the third connecting serrated part CT3 may join at the point P3.

A plurality of first accommodation spaces S1 may be provided. The side wall BC_SW of the first boundary connecting serrated part BC and the side wall CT1_SW1 of the first connecting serrated part CT1 may define one of the first accommodation spaces S1. The adjacent side walls CT_SW of the connecting serrated part CT may also define another one of the first accommodation spaces S1. For example, the side wall CT1_SW2 of the first connecting serrated part CT1 and the side wall CT2_SW1 of the second connecting serrated part CT2 may define one of the first accommodation spaces S1. As another example, the side wall CT2_SW2 of the second connecting serrated part CT2 and the side wall CT3_SW1 of the third connecting serrated part CT3 may define another one of the first accommodation spaces S1. The points P1 to P3 may be respectively bottommost positions of the plurality of first accommodation spaces S1. For example, an outermost one S11 of the first accommodation spaces S1, closest to the first plate PL1, may have a bottommost position thereof at the point P1. A next closest one S12 of the first accommodation spaces S1 to the first plate PL1 may have a bottommost position thereof at the point P2. A next closest one S13 of the first accommodation spaces S1 to the first plate PL1 may have a bottommost position thereof at the point P3. On the plurality of first accommodation spaces S1, a plurality of wafers may be accommodated during a semiconductor manufacturing process such as a cleaning process. For example, an outermost wafer may be accommodated on the outermost one S11, a first inner wafer may be accommodated on the next one S12, and a second inner wafer may be accommodated on the third one S13. The plurality of wafers may have the same shapes and sizes as each other (e.g., the same diameter, the same thickness, etc.).

From a perspective view, the side wall BC_SW of the first boundary connecting serrated part BC and the side wall of the first connecting serrated part CT1 may join at an adjoining line extending in the third direction D3 and crossing the point P1. From a perspective view, adjacent side walls CT_SW of the connecting serrated part CT may join at another adjoining line extending in the third direction D3 and crossing the points P2 or P3.

In the second direction D2, a distance DT2 between the points P1 and P2 may be the same as a distance DT3 between the points P2 and P3. For example, the distance DT2 between the adjoining lines crossing the points P1 and P2 may be the same as the distance DT3 between the adjoining lines crossing the points P2 and P3 in the second direction D2. For example, the distances D2 and D3 between the bottommost positions P1 to P3 of adjacent first accommodation spaces S1 may be the same as each other. The bottommost position P1 of a closest one of the adjacent first accommodation spaces S1 may be spaced apart from an extension line of an inner wall PL1_ISW of the first plate PL1 by a distance DT1 in the second direction D2. In some embodiments, a distance in the second direction D2 between the bottommost position P1 of the outermost accommodation space S11 and an extension line of an inner wall PL1_ISW may become the same as or less than a distance in the second direction between points P2 and P3, and when wafers are present, may be the same as or less than a distance in the second direction between the outermost wafer and the first inner wafer adjacent to the outermost wafer.

The second connecting part CN2 may extend from the first plate PL1 or the second plate PL2. More specifically, the second connecting part CN2 may extend from the first support part SP1 or the second support part SP2.

The second connecting part CN2 may be directly connected to the first plate PL1 or the second plate PL2. More specifically, the second connecting part CN2 may be directly connected to the first support part SP1 or the second support part SP2.

The second connecting part CN2 may be disposed between the first plate PL1 and the second plate PL2.

The second connecting part CN2 may extend in the second direction D2.

The second connecting part CN2 may have, but is not limited to, a rectangular parallelepiped shape. For example, the second connecting part CN2 may have a cylindrical shape extending in the second direction D2.

The description of the second connecting part CN2 may be substantially the same as the description of the first connecting part CN1.

Although not shown, there may be third and fourth boundary connecting serrated parts which correspond to each of the first boundary connecting serrated part BC and the second boundary connecting serrated part BC. Further, there may be an additional connecting serrated part which corresponds to the connecting serrated part CT. The third and fourth boundary connecting serrated parts and the additional connecting serrated part may protrude from the second connecting part CN2.

The first connecting part CN1 and the second connecting part CN2 may be disposed at the same height level in the first direction D1. The first connecting part CN1 and the second connecting part CN2 may be spaced apart from each other in the third direction D3.

The shelf part S may extend from the first plate PL1 or the second plate PL2. More specifically, the shelf part S may extend from the first support part SP1 or the second support part SP2.

The shelf part S may be directly connected to the first plate PL1 or the second plate PL2. More specifically, the shelf part S may be directly connected to the first support part SP1 or the second support part SP2.

The shelf part S may be disposed between the first plate PL1 and the second plate PL2.

The shelf part S may be disposed between the first connecting part CN1 and the second connecting part CN2 from the viewpoint of a plan view in the first direction D1.

The shelf part S may extend in the second direction D2.

The shelf part S may be a rod or support beam having, but not limited to, a rectangular parallelepiped shape. In one embodiment, the shelf part S has a cylindrical shape extending in the second direction D2.

The shelf part S may not be disposed at the same height level as the first connecting part CN1 in the third direction D3. As shown, the height level of the first connecting part CN1 may be higher than the height level of the shelf part S.

The shelf part S may not be disposed at the same height level as the second connecting part CN2 in the third direction D3. As shown, the height level of the second connecting part CN2 may be higher than the height level of the shelf part S.

A first boundary shelf serrated part (also referred to as an outermost bottom protrusion) BS and a plurality of shelf serrated parts (also referred to as inner bottom protrusions) ST may protrude from the shelf part S. The first boundary shelf serrated part BS and the plurality of shelf serrated parts ST may be described collectively as bottom protrusions.

The first boundary shelf serrated part BS may be disposed at a portion in which the shelf part S and the first plate PL1 are directly connected. The first boundary shelf serrated part BS may protrude from the shelf part S in the first direction D1. The first boundary shelf serrated part BS may protrude from the first plate PL1 in the second direction D2.

Although not shown, a second boundary shelf serrated part may also be disposed at a portion in which the shelf part S and the second plate PL2 are directly connected. In this case, the second boundary shelf serrated part may protrude from the second plate PL2 in the second direction D2.

The first boundary shelf serrated part BS, the plurality of shelf serrated parts ST and the second boundary shelf serrated part may be formed integrally. The description of the second boundary connecting serrated part may be substantially the same as the description of the first boundary connecting serrated part BC.

The first boundary shelf serrated part BS may include an upper surface BS_US of the first boundary shelf serrated part BS and a side wall BS_SW of the first boundary shelf serrated part BS.

The upper surface BS_US of the first boundary shelf serrated part BS may extend in the second direction D2.

The side wall BS_SW of the first boundary shelf serrated part BS may form a second angle θ2 with an upper surface (also referred to as a boundary between the first connecting part and the plurality of connecting serrated parts) S_US of the shelf part S.

The upper surface BS_US of the first boundary shelf serrated part BS and the side wall BS_SW of the first boundary shelf serrated part BS may be directly connected to each other.

The shelf serrated part ST may be disposed on the upper part of the shelf part S. The shelf serrated part ST may protrude from the shelf part S in the first direction D1.

Each of the shelf serrated parts ST may include an upper surface ST_US of the shelf serrated part ST and two side walls ST_SW of the shelf serrated part ST. For example, the first shelf serrated part ST1 may include an upper surface ST1_US of the first shelf serrated part ST1 and two side walls ST1_SW1 and ST1_SW2 of the first shelf serrated part ST1.

The upper surface ST_US of the shelf serrated part ST may extend in the second direction D2. For example, the upper surface ST1_US of the first shelf serrated part ST1 may extend in the second direction D2.

The side walls ST_SW of the shelf serrated part ST may form a second angle θ2 with the upper surface S_US of the shelf part S. For example, the side walls ST1_SW1 or ST1_SW2 of the first shelf serrated part ST1 may form the second angle θ2 with the upper surface S_US of the shelf part S. The side walls ST_SW of the shelf serrated part ST may also form the first angle θ2 with an upper surface ST_US of the plurality of shelf serrated parts ST.

Each of the side wall ST_SW of the shelf serrated part ST and the upper surface ST_US of the shelf serrated part ST may be directly connected to each other. For example, the side walls ST1_SW1 or ST1_SW2 of the first shelf serrated part ST1 and the upper surface ST1_US of the first shelf serrated part ST1 may be directly connected to each other.

The upper surface BS_US of the first boundary shelf serrated part BS and the upper surface ST_US of the shelf serrated part ST may be disposed on the same plane as each other. For example, the upper surface BS_US of the first boundary shelf serrated part BS, the upper surface ST1_US of the first shelf serrated part ST1, the upper surface ST2_US of the second shelf serrated part ST2, and the upper surface ST3_US of the third shelf serrated part ST3 may be disposed on the same plane.

From the viewpoint of a front view as in FIGS. 2 and 5, the shelf serrated part ST may have a trapezoidal shape in which the length of the lower surface of the shelf serrated part ST in the second direction D2 is longer than the length of the upper surface ST_US of the shelf serrated part ST in the second direction D2. For example, a length from a point P4 to a point P5 may be longer than the length of the upper surface ST1_US of the first shelf serrated part ST1 in the second direction D2. As another example, a length from the point P5 to the point P6 may be longer than the length of the upper surface ST2_US of the second shelf serrated part ST2 in the second direction D2.

From the viewpoint of the front view as in FIGS. 2 and 5, the side walls BS_SW of the first boundary shelf serrated part BS and the side walls of the shelf serrated part ST may join together. For example, the side wall BS_SW of the first boundary shelf serrated part BS and the side walls ST1_SW1 of the first shelf serrated part ST1 may join at the point P4.

From the viewpoint of the front view as in FIGS. 2 and 5, adjacent shelf serrated parts ST may join together. For example, adjacent two side walls ST_SW of the shelf serrated part ST may join at a point. For example, the side walls ST1_SW2 of the first shelf serrated part ST1 and the side walls ST2_SW1 of the second shelf serrated part ST2 may join at the point P5. As another example, the side walls ST2_SW2 of the second shelf serrated part ST2 and the side walls ST3_SW1 of the third shelf serrated part ST3 may join at a point P6.

A plurality of second accommodation spaces S2 may be provided. The side wall BS_SW of the first boundary shelf serrated part BS and the side walls ST1_SW1 of the first shelf serrated part ST1 may define a second accommodation space S2.

The adjacent side walls ST_SW of the shelf serrated part ST may also define another one of the second accommodation spaces S2. For example, the side walls ST1_SW2 of the first shelf serrated part ST1 and the side walls ST2_SW1 of the second shelf serrated part ST2 may define one of the second accommodation spaces S2. As another example, the side walls ST2_SW2 of the second shelf serrated part ST2 and the side walls ST3_SW1 of the third shelf serrated part ST3 may define another one of the second accommodation spaces S2. The points P4 to P6 may be respectively bottommost positions of the plurality of second accommodation spaces S2. For example, an outermost one S21 of the second accommodation spaces S2, closest to the first plate PL1, may have a bottommost position thereof at the point P4. A next closet one S22 of the second accommodation spaces S2 to the first plate PL1 may have a bottommost position thereof at the point P5. A next closest one S23 of the second accommodation spaces S2 to the first plate PL1 may have a bottommost position thereof at the point P6. On the plurality of second accommodation spaces S2, a plurality of wafers may be accommodated during a semiconductor manufacturing process such as a cleaning process. For example, an outermost wafer may be accommodated on the outermost one S21, a first inner wafer may be accommodated on the next one S22, and a second inner wafer may be accommodated on the third one S23.

From a perspective view, the first side wall BS_SW of the boundary shelf serrated part BS and the side wall of the first shelf serrated part ST1 may join at an adjoining line extending in the third direction D3 and crossing the point P4. From a perspective view, adjacent side walls ST_SW of the shelf serrated part ST may join at another adjoining line extending in the third direction D3 and crossing the points P5 or P6.

In the second direction D2, a distance DT12 between the points P4 and P5 may be the same as a distance DT13 between the points P5 and P6. For example, the distance DT12 between the adjoining lines crossing the points P4 and P5 may be the same as the distance DT13 between the adjoining lines crossing the points P5 and P6 in the second direction D2. For example, the distances D2 and D3 between the bottommost positions P5 to P6 of adjacent second accommodation spaces S2 may be the same as each other.

The bottommost position P4 of a closest one of the adjacent second accommodation spaces S2 may be spaced apart from an extension line of an inner wall PL1_ISW of the first plate PL1 by a distance DT11 in the second direction D2.

The distance DT11 may be different from the distances DT12 and DT13. The distance DT11 may be determined based on a thickness of the wafer to be accommodated. Based on the wafer thickness in the second direction D2, the distance DT11 may be determined such that a first in-process distance in the second direction between the outermost wafer and the first inner wafer is the same as a second in-process distance in the second direction between the outermost wafer and the extension line of the inner wall PL1_ISW. For example, a ratio of the distance DT11 to the distance DT12 (or the distance DT13) may be determined so as to maintain the first in-process distance and the second in-process distance equal during the cleaning process. For example, the ratio R1 of the distance DT11 to the distance DT12 (or the distance DT13) may be greater than 80%.

The structure of the first boundary connecting serrated part BC and the structure of the first boundary shelf serrated part BS may be substantially identical to each other. Moreover, the structure of the connecting serrated part CT and the structure of the shelf serrated part ST may be substantially identical to each other. For example, the distances DT1 and DT11 may be the same as each other. For example, the distances DT2, DT3, DT12 and DT13 may be the same as each other. For example, the ratios R and R1 may be the same as each other.

The number of first accommodation spaces S1 and the number of second accommodation spaces S2 may not be fixed. For example, the number of first accommodation spaces S1 and the number of second accommodation spaces S2 may vary depending on the interval between the first plate PL1 and the second plate PL2. In addition, the number of first accommodation spaces S1 and the number of second accommodation spaces S2 may vary depending on the distance between the adjacent first accommodation spaces S1, the distance between the second accommodation spaces S1, the magnitude of the first angle θ1, the magnitude of the second angle θ2, and the like.

The number of connecting serrated parts CT and the number of shelf serrated parts ST may not be fixed. For example, the number of connecting serrated parts CT and the number of shelf serrated parts ST may vary depending on the interval between the first plate PL1 and the second plate PL2. In addition, the number of connecting serrated parts CT and the number of shelf serrated parts ST may not be fixed, depending on the distance between adjacent first accommodation spaces S1, the distance between second accommodation spaces S2, the magnitude of the first angle θ1, the magnitude of the second angle θ2, and the like.

In some embodiments, the first angle θ1 and the second angle θ2 may be identical to each other.

In some embodiments, the number of first accommodation spaces S1 and the number of second accommodation spaces S2 may be substantially identical to each other. The number of connecting serrated parts CT and the number of shelf serrated parts ST may be the same as each other.

Figure 8:
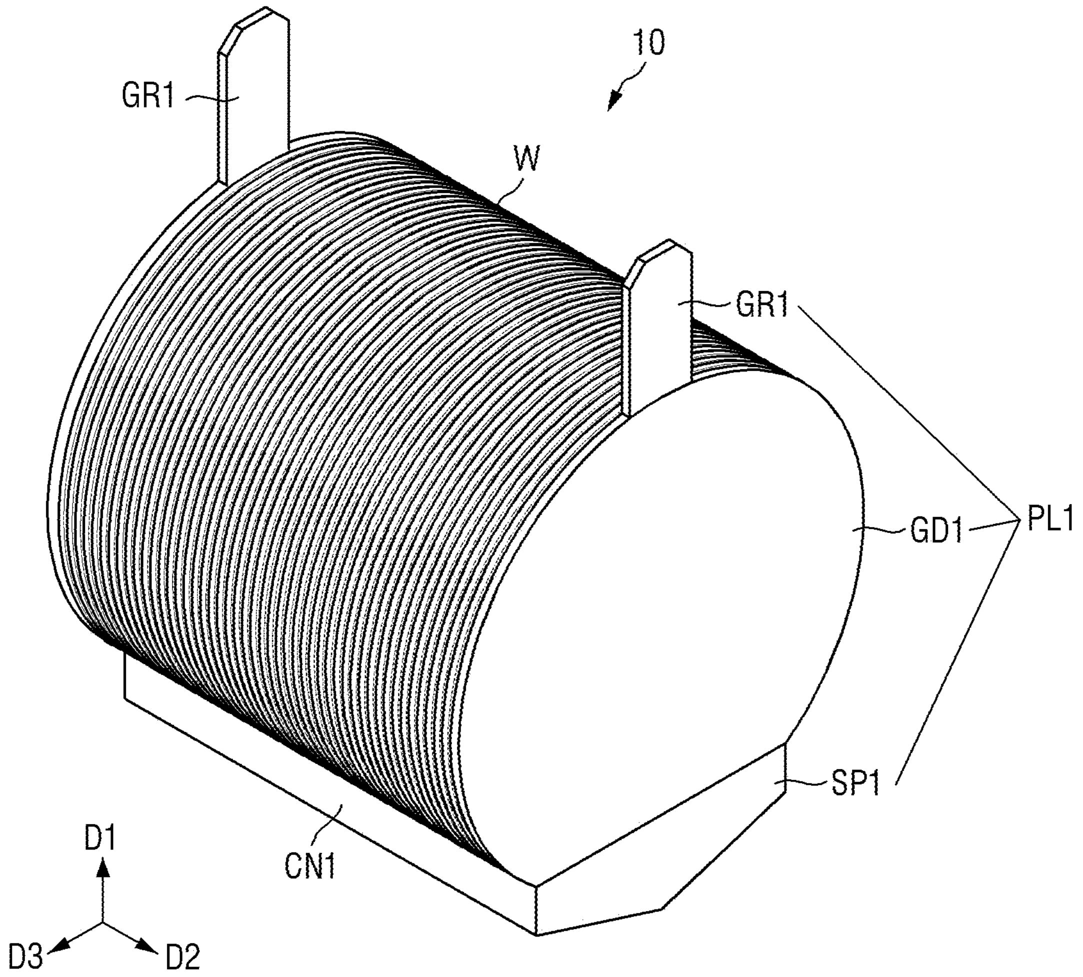
FIG. 8 is a perspective view for explaining a wafer cleaning apparatus with a wafer accommodated therein according to some embodiments of the present invention.
Figure 9:
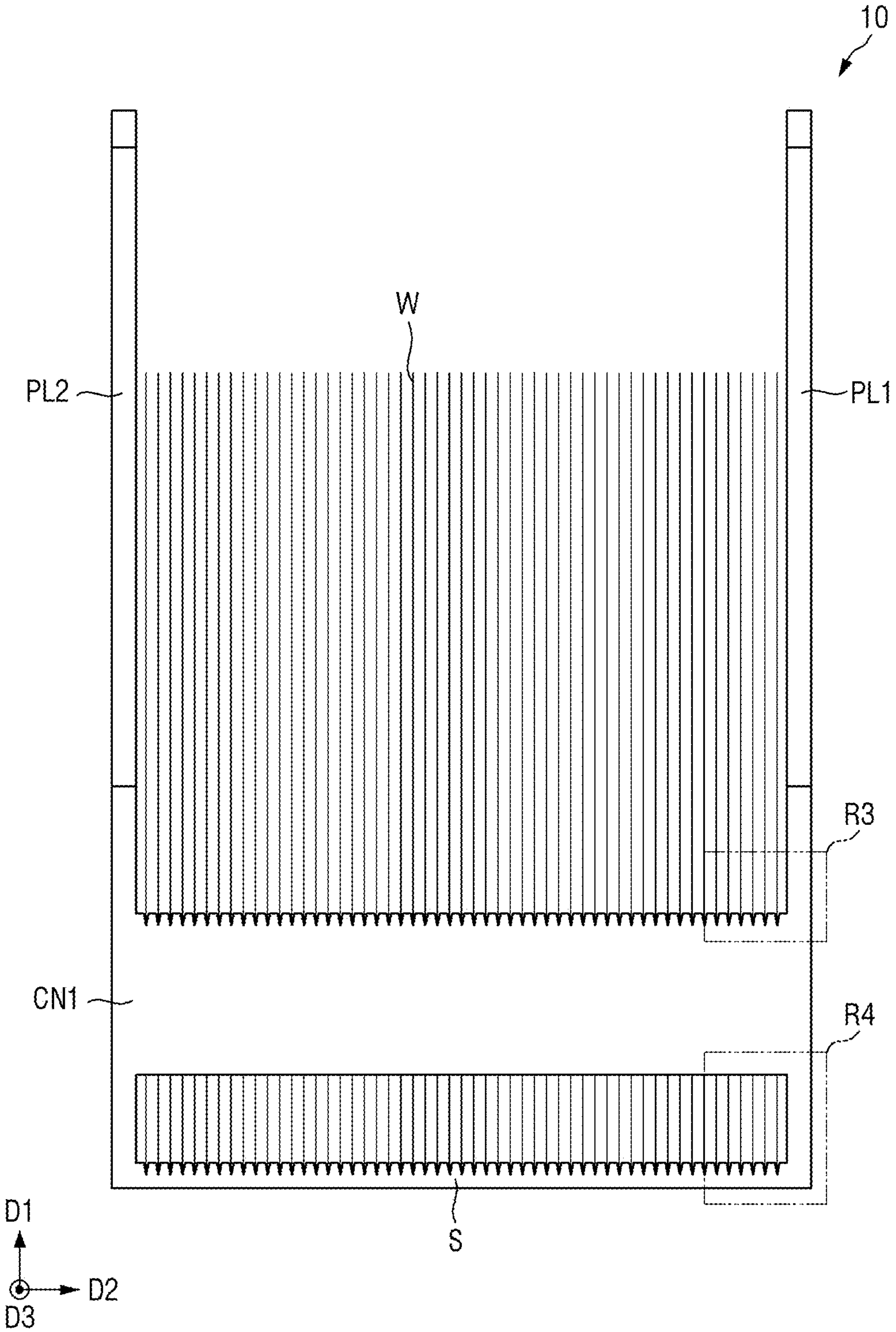
FIG. 9 is a front view of the wafer cleaning apparatus with a wafer accommodated therein according to some embodiments of the present invention.

The first accommodation space S1 and the second accommodation space S2 may accommodate wafers W (shown in FIGS. 8 and 9).

When the structure of the first accommodation space S1 and the structure of the second accommodation space S2 are substantially identical to each other, the wafers W may be safely accommodated in the first accommodation space S1 and the second accommodation space S2.

Figure 10:
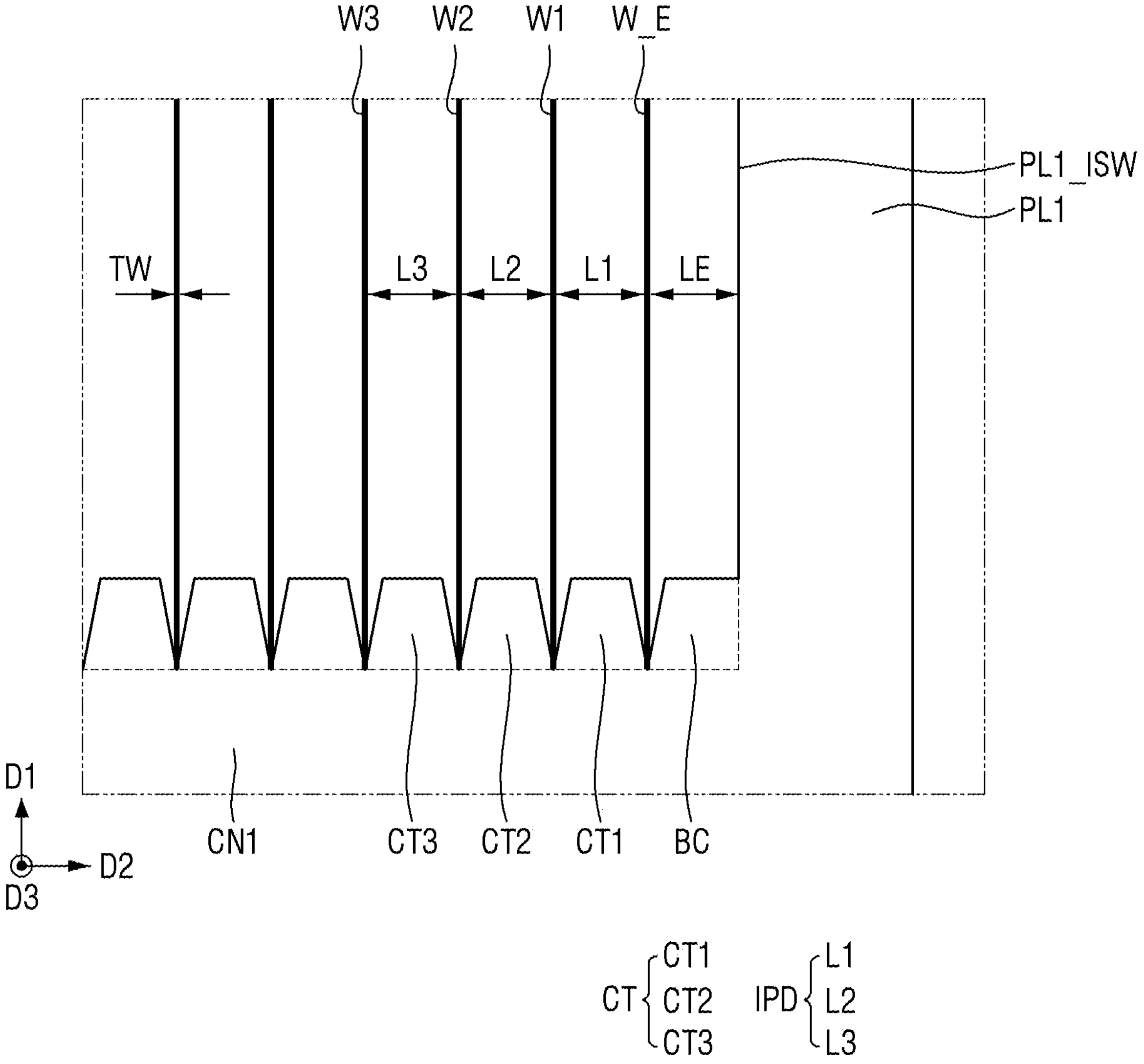
FIG. 10 is an enlarged view of a region R3 of FIG. 9.
Figure 11:
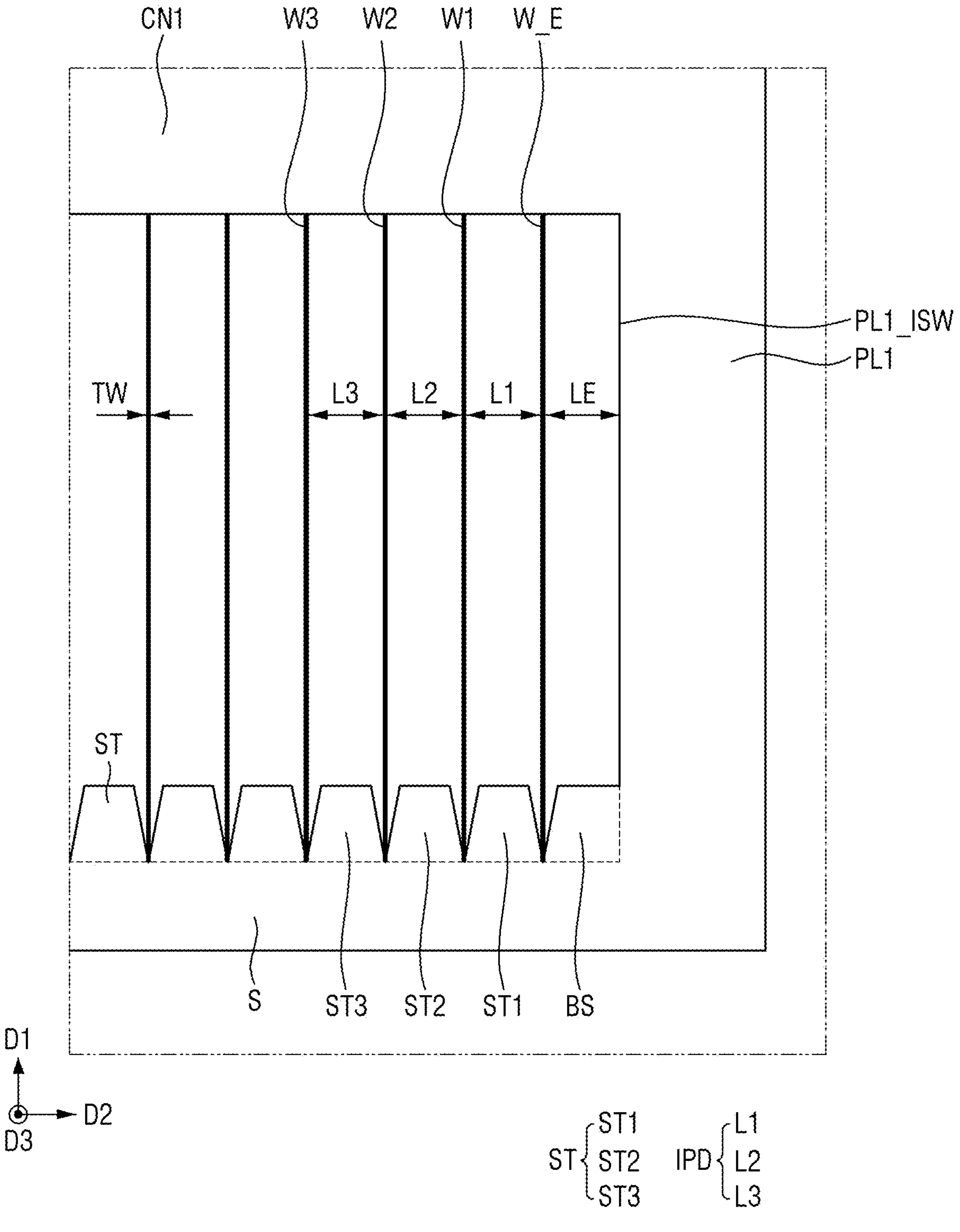
FIG. 11 is an enlarged view of a region R4 of FIG. 9.

FIG. 8 is a perspective view for explaining a wafer cleaning apparatus with wafers accommodated therein according to some embodiments of the present invention. FIG. 9 is a front view of the wafer cleaning apparatus with wafers accommodated therein according to some embodiments of the present invention. FIG. 10 is an enlarged view of a region R3 of FIG. 9. FIG. 11 is an enlarged view of a region R4 of FIG. 9.

Referring to FIGS. 8 to 11, the wafer cleaning apparatus 10 may accommodate the wafers W. For convenience of explanation, the explanation will focus on the differences from those explained with reference to FIGS. 1 to 7.

The wafer W may be accommodated in the first accommodation space S1 (shown in FIG. 3) and the second accommodation space S2 (shown in FIG. 5).

The wafer W may be disposed between the first plate PL1 and the second plate PL2. The wafer W may be disposed on the first connecting part CN1, the second connecting part CN2, and the shelf part S. The wafers W may have the same shapes and sizes as each other. For example, the wafers W may have the same thickness TW.

One or more wafers W may be disposed between the first plate PL1 and the second plate PL2. The maximum number of wafers W disposed between the first plate PL1 and the second plate PL2 may be referred to as N. N is not a fixed number, but may be any number equal to or greater than 1.

N may be equal to the number of first accommodation spaces S1 on the first connecting part CN1 (or the second connecting part CN2) disposed between the first plate PL1 and the second plate PL2. N may be equal to the number of second accommodation spaces S2 on the first connecting part CN1 (or the second connecting part CN2) disposed between the first plate PL1 and the second plate PL2. N may be equal to a value obtained by adding 1 to the number of connecting serrated parts CT on the first connecting part CN1 (or the second connecting part CN2) disposed between the first plate PL1 and the second plate PL2. N may be equal to a value obtained by adding 1 to the number of shelf serrated parts ST disposed between the first plate PL1 and the second plate PL2. The serrated parts ST may be described as protrusions and/or the accommodation spaces S1 and S2 may be described as recesses.

The wafer W may come into contact with the boundary connecting serrated parts BC (shown in FIG. 3), the connecting serrated part CT (shown in FIG. 3), the boundary shelf serrated parts BS (shown in FIG. 5), and the shelf serrated part ST (shown in FIG. 5).

The wafer W may be bulk silicon or silicon-on-insulator (SOI). In contrast, the wafer W may be a silicon wafer, or may include, but is not limited to, other materials, such as, for example, silicon germanium, silicon germanium on insulator (SGOI), indium antimonide, lead telluride, indium arsenide, indium phosphide, gallium arsenide or gallium antimonide.

Among the wafers W, a wafer W disposed closest to the first plate PL1 may be defined as a boundary wafer W_E (also referred to as an outermost wafer).

The boundary wafer W_E may be spaced apart from the first plate PL1 in the second direction D2. A spaced distance between the boundary wafer W_E and the first plate PL1 may be a distance LE.

Among the wafers W, a wafer W disposed at a place second-closest to the first plate PL1 may be defined as the first wafer W1 (also referred to as a first inner outermost wafer). Among the wafers W, a wafer W disposed at a place third-closest to the first plate PL1 may be defined as a second wafer W2 (also referred to as a second inner wafer). Among the wafers W, a wafer W disposed at a place fourth-closest to the first plate PL1 may be defined as a third wafer W3 (also referred to as a third inner wafer).

Each of the wafers may be spaced apart from each other. For example, two adjacent wafers may be spaced apart by distances L1, L2 and L3, which may be the same as each other. The distances L1, L2 and L3 may correspond to the distance IPD of the equations described previously. The first wafer W1 may be spaced apart from the boundary wafer W_E in the second direction D2. The spaced distance between the first wafer W1 and the boundary wafer W_E may be the distance L1.

The second wafer W2 may be spaced apart from the first wafer W1 in the second direction D2. The spaced distance between the second wafer W2 and the first wafer W1 may be the distance L2.

The third wafer W3 may be spaced apart from the second wafer W2 in the second direction D2. The spaced distance between the third wafer W3 and the second wafer W2 may be the distance L3.

The distance between the boundary wafer W_E and the first plate PL1 may be equal to the distance between the boundary wafer W_E and the first wafer W1. For example, the distance LE and the distance L1 may be identical to each other.

The distance between the adjacent wafers W may be constant. For example, the distances L1, L2, L3, and the like may be identical to each other.

The boundary wafer W_E may be disposed between the first boundary connecting serrated part BC and the first connecting serrated part CT1. The first wafer W1 may be disposed between the first connecting serrated part CT1 and the second connecting serrated part CT2. The second wafer W2 may be disposed between the second connecting serrated part CT2 and the third connecting serrated part CT3.

The boundary wafer W_E may be disposed between the first boundary shelf serrated part BS and the first shelf serrated part ST1. The first wafer W1 may be disposed between the first shelf serrated part ST1 and the second shelf serrated part ST2. The second wafer W2 may be disposed between the second shelf serrated part ST2 and the third shelf serrated part ST3.

Figure 12:
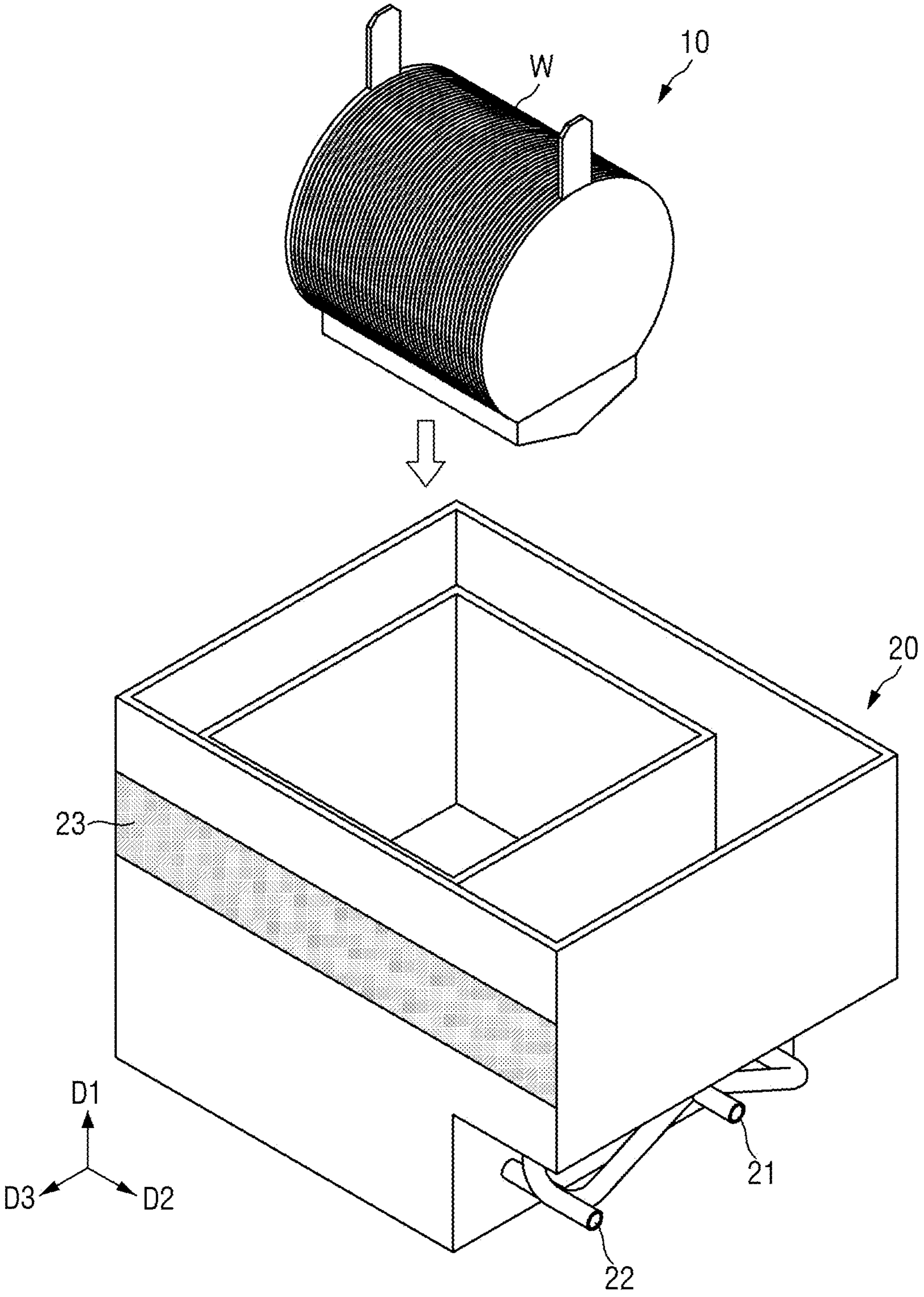
FIG. 12 is a perspective view for explaining a wafer cleaning system according to some embodiments of the present invention.

FIG. 12 is a perspective view for explaining a wafer cleaning system according to some embodiments of the present invention.

Referring to FIG. 12, the wafer W cleaning system may include a wafer cleaning apparatus 10 in which the wafer W is accommodated, a cleaning container 20, and a heating part 23.

The cleaning container 20 may have a hollow shape. The cleaning container 20 may accommodate the wafer cleaning apparatus 10 to accommodate the wafers W. A cleaning solution may be injected into the interior of the cleaning container 20 from the exterior of the cleaning container 20. The cleaning solution may be discharged from the interior of the cleaning container 20 to the exterior of the cleaning container 20.

The cleaning container 20 may have a stepped shape. The shape of the cleaning container 20 is not limited to that shown in the drawings, and may be any shape suitable for accommodating the cleaning container 20.

The cleaning container 20 may include an injection part 21 through which the cleaning solution is injected into the cleaning container 20, and a discharge part 22 through which the cleaning solution is discharged from the cleaning container 20. The positions of the injection part 21 and the cleaning part are not fixed to the positions shown in FIG. 12, but may be disposed at appropriate positions on the surface of the cleaning container 20.

The cleaning solution may be a solution capable of removing foreign substances on the wafer W. For example, the cleaning solution may be a phosphoric acid solution.

The cleaning solution may remove foreign substances on the wafer W through a chemical reaction with the cleaning solution.

The heating part 23, such as an electrical or other type of heater, may be formed on at least one side wall of the cleaning container 20. For example, the heating part 23 may be formed on three side walls among the side walls of the cleaning container 20.

The temperature of the heating part 23 may rise to a temperature higher than the boiling point of the cleaning solution injected into the cleaning container 20. When the temperature of the heating part 23 rises, the cleaning liquid injected into the cleaning container 20 may boil.

While the wafer cleaning apparatus 10 accommodating the wafers W contained within the cleaning container 20, the wafer cleaning apparatus 10 or the cleaning container 20 may reciprocate up and down or side to side within a certain distance, thereby performing a wafer cleaning process.

Figure 13:
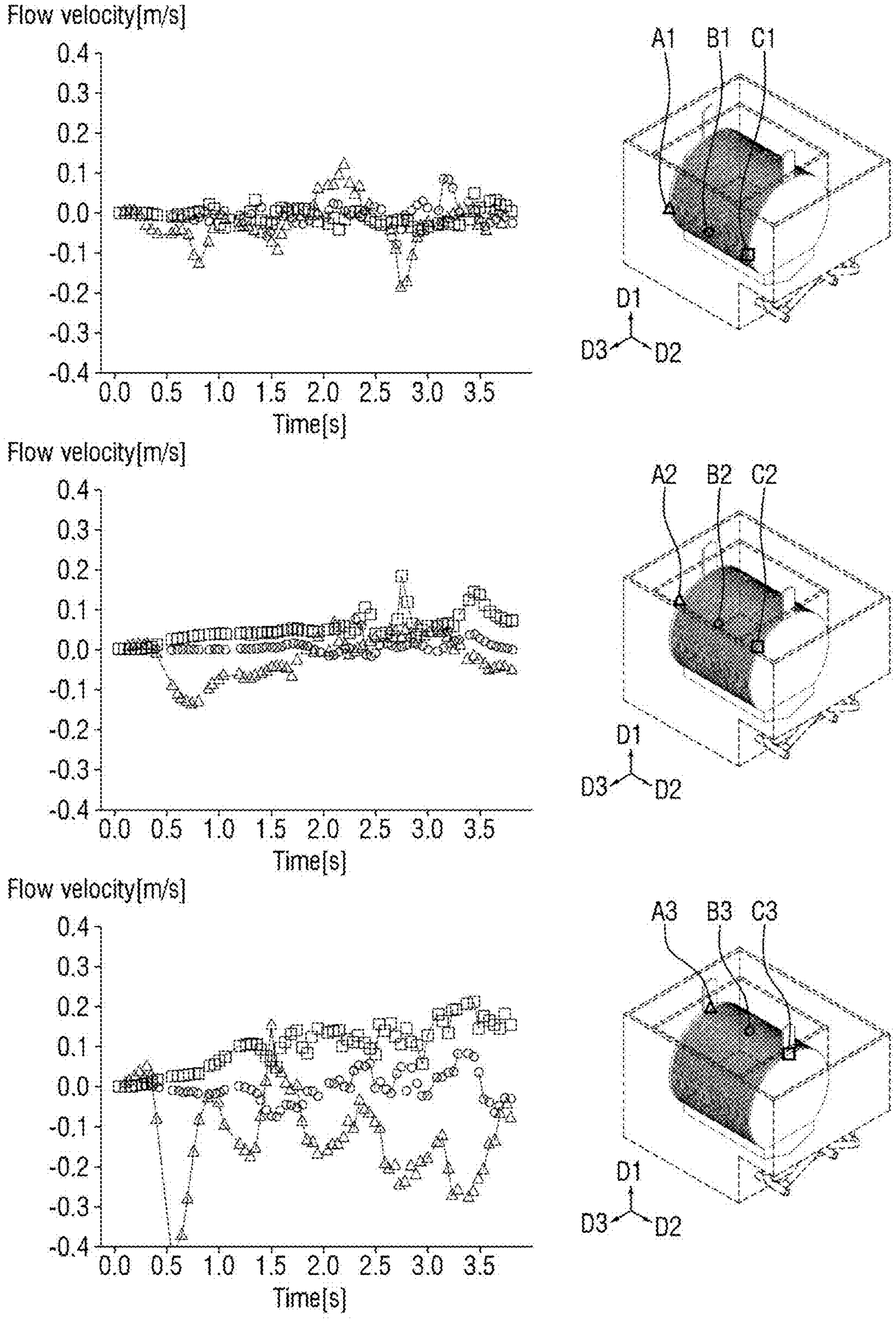
FIG. 13 is a graph showing performance in an embodiment of FIGS. 10 and 11.
Figure 14:
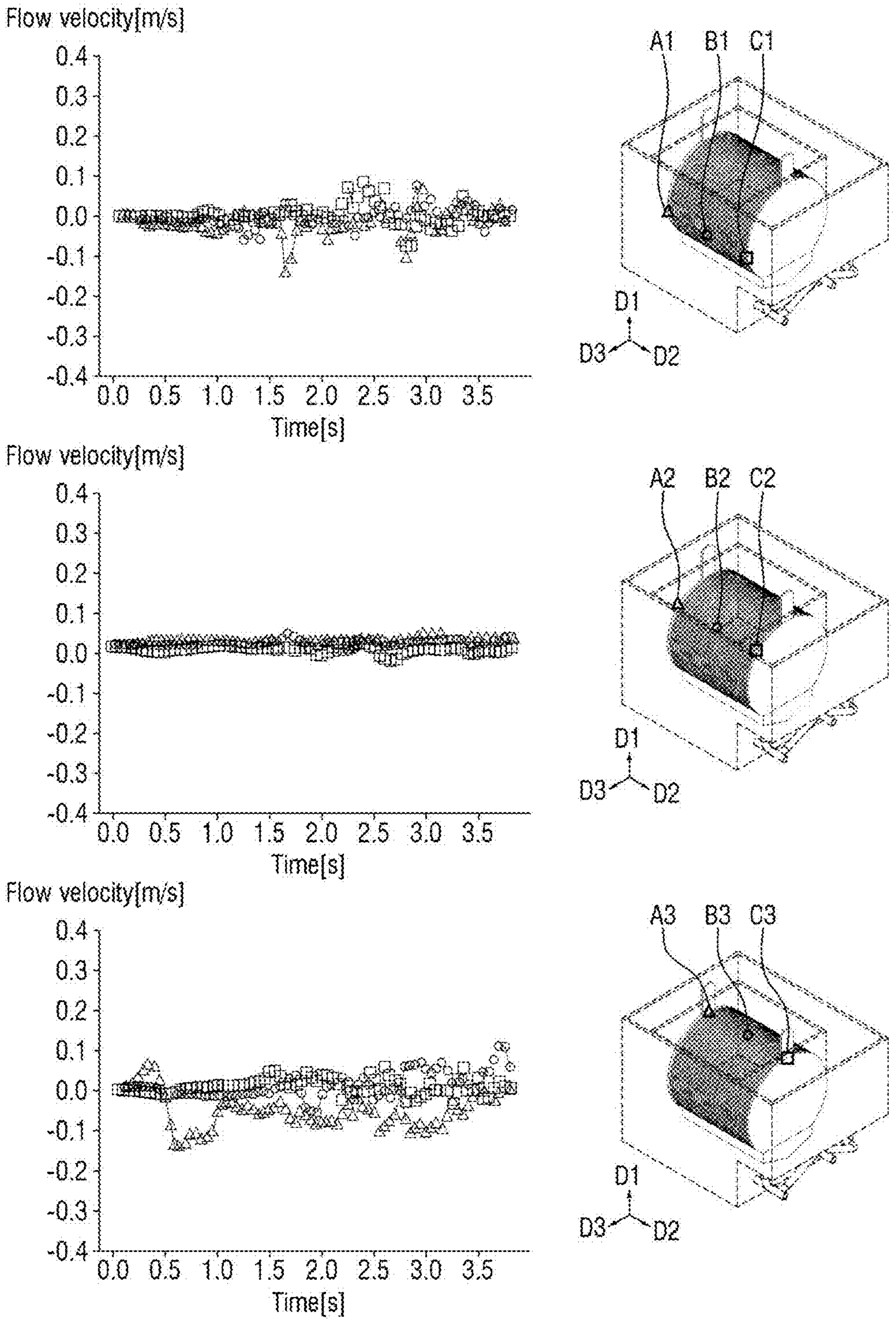
FIG. 14 is a graph showing performance in another embodiment of FIGS. 10 and 11.

FIGS. 13 and 14 are graphs for explaining improved performance of the wafer cleaning apparatus according to some embodiments of the present invention.

FIG. 13 is a graph showing performance in a case where the distance LE of FIGS. 10 and 11 is different from the interval between wafers W (e.g., the distances L1, L2 or L3). FIG. 14 is a graph showing performance in a case where the distance LE of FIGS. 10 and 11 is equal to the interval between wafers W (e.g., the distances L1, L2, or L3).

FIGS. 13 and 14 are graphs showing flow velocity of the cleaning solution in the second direction D2 at specific positions (e.g., A1, B1, C1, A2, B2, C2, A3, B3, C3) of the wafer cleaning apparatus 10, in which the wafers W are accommodated during a cleaning process.

When comparing the graphs of FIG. 13 and FIG. 14 at corresponding positions, the flow velocities of the cleaning solution are less variable in FIG. 14 than in FIG. 13.

In conclusion, the flow of the cleaning solution around the wafers W is more stable when the distance LE (also referred to as second in-process distance) is equal to the interval (also referred to as first in-process distance) between the wafers W than when the distance LE is different from the interval between the wafers W. Therefore, when the distance LE is equal to the interval between the wafers W, the possibility of damage to the wafers W due to the flow of cleaning solution is significantly reduced. For example, when the distance LE is equal to the interval between the wafers W, damage to the wafers W due to the cleaning operation of wafers W may be prevented.

For example, as shown in FIG. 3, when the distance DT1 from the first plate PL1 (or the second plate PL2) to the point P1 in the second direction D2 is smaller than the distance DT2 from the point P1 to the point P2 in the second direction D2 by half the wafer thickness TW, the possibility of damage to the wafers W due to the flow of the cleaning solution and/or the flow of bubbles generated by boiling of the cleaning solution is significantly reduced. Alternatively, as shown in FIG. 5, when the distance DT12 from the first plate PL1 (or the second plate PL2) to the point P4 in the second direction D2 is smaller than the distance DT12 from the point P4 to the point P5 in the second direction D2 by half the wafer thickness TW, the possibility of damage to the wafers W is significantly reduced.

Figure 15:
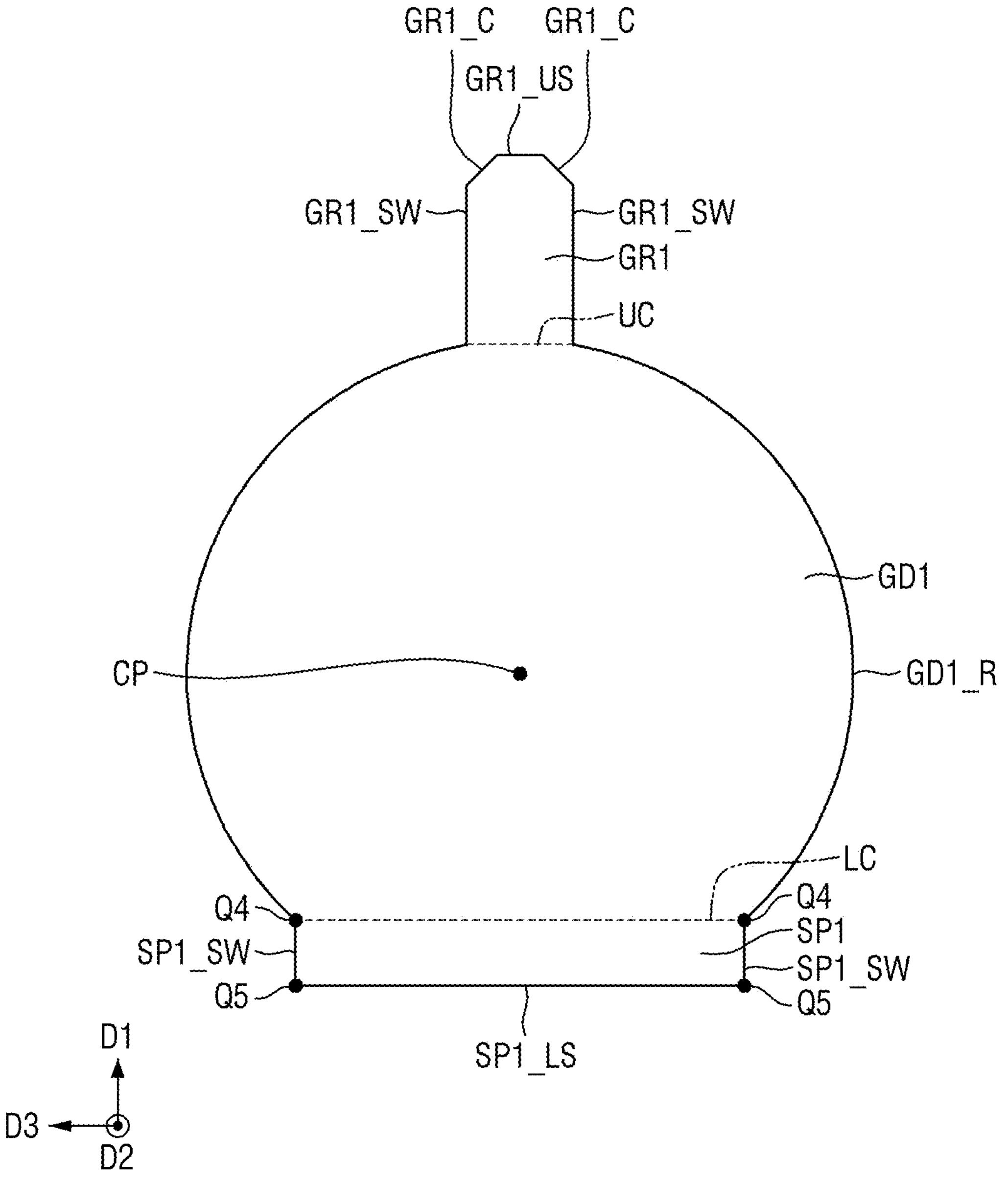
FIG. 15 is a diagram for explaining a wafer cleaning apparatus according to some other embodiments of the present invention.

FIG. 15 is a diagram for explaining a wafer cleaning apparatus according to some embodiments of the present invention. For convenience of explanation, the explanation will focus on the differences from those explained with reference to FIGS. 1 to 7.

Referring to FIG. 15, the first support part SP1 may have a rectangular shape. More specifically, the first support part SP1 may include a lower surface SP1_LS of the first support part SP1 extending in the third direction D3, and side walls SP1_SW of the first support part SP1 that connect the lower surface SP1_LS of the first support part SP1 and the side wall GD1_R of the first guide part GD1. For example, the two side walls SP1_SW of the first support part SP1, the lower surface SP1_LS of the first support part SP1, and the lower chord LC may form a rectangular shape.

The side walls SP1_SW of the first support part SP1 may extend in the first direction D1.

The point P1 at which the side walls SP1_SW of the first support part SP1 and the lower chord LC join may be designated by a point Q4. The point P1 at which the lower surface SP1_LS of the first support part SP1 and the side SP1_SW of the first support part SP1 join may be designated by a point Q5. Vertices of the rectangular structure of the first support part SP1 may include the point Q4 and the point Q5.

Figure 16:
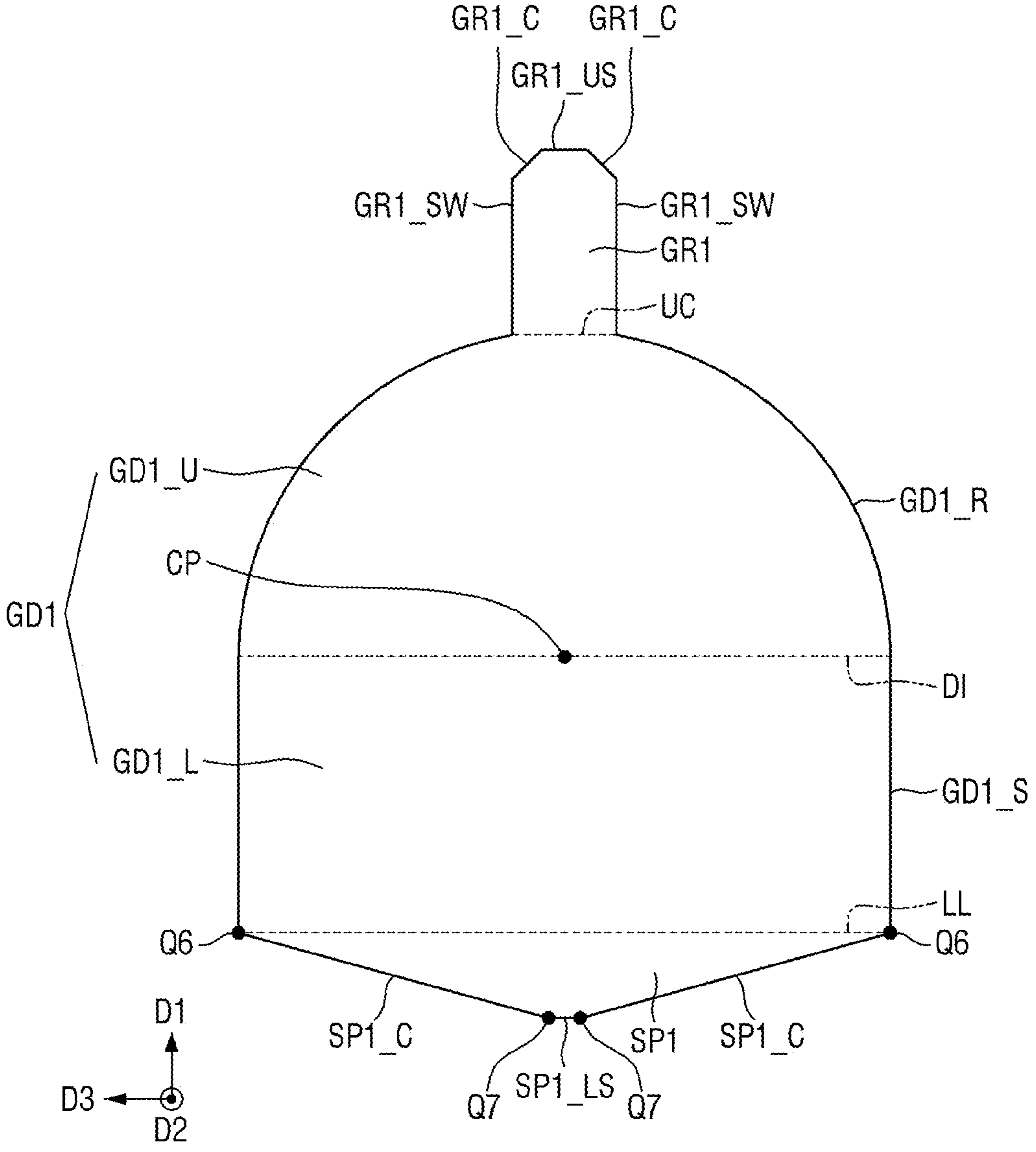
FIG. 16 is a diagram for explaining a wafer cleaning apparatus according to yet some other embodiments of the present invention.

FIG. 16 is a diagram for explaining a wafer cleaning apparatus according to some embodiments of the present invention. For convenience of explanation, the explanation will focus on the differences from those explained with reference to FIGS. 1 to 7.

Referring to FIG. 16, the first guide part GD1 may have a shape in which an incomplete circle and a rectangle are directly connected (or combined) with an intermediate line DI as a boundary therebetween. The first guide part GD1 may include a first upper guide part GD1_U and a first lower guide part GD1_L.

The first upper guide part GD1_U may have a shape obtained by cutting a semicircle along the upper chord UC included in the semicircle and extending in the third direction D3. The intermediate line DI may extend in the third direction D3. In this case, the diameter of the semicircle may be the intermediate line DI. For example, the first guide part GD1 may have a shape in which one side of the upper chord UC and one side of the intermediate line DI are directly connected by a curved line, and the other side of the upper chord UC and the other side of the intermediate line DI are directly connected by a curved line.

The first lower guide part GD1_L may have a rectangular shape. The side wall GD1_S of the first lower guide part GD1_L may connect the intermediate line DI and a lower line LL. The two side walls of the first lower guide part GD1_L, the intermediate line DI, and the lower line LL may form a rectangle shape.

The first upper guide part GD1_U and the first lower guide part GD1_L may be directly connected to each other with the intermediate line DI as a boundary.

The side wall GD1_R of the first upper guide part GD1_U may have a round shape.

The side wall of the first lower guide part GD1_L may extend in the first direction D1.

The first support part SP1 may have a trapezoidal shape. More specifically, the first support part SP1 may include a lower surface SP1_LS of the first support part SP1 extending in the third direction D3, and inclined surfaces SP1_C of the first support part SP1 that connect the lower surface SP1_LS of the first support part SP1 and the side walls GD1_S of the first lower guide part GD1_L. For example, the two inclined surfaces SP1_C of the first support part SP1, the lower surface SP1_LS of the first support part SP1, and the lower line LL may form a rectangular shape.

A point at which the inclined surface SP1_C of the first support part SP1 and the lower line LL join may be designated by a point Q6. A point at which the lower surface SP1_LS of the first support part SP1 and the inclined surface SP1_C of the first support part SP1 join may be designated by a point Q7. Vertices of the trapezoidal structure of the first support part SP1 may include the point Q6 and the point Q7.

The first support part SP1 may be directly connected to the first guide part GD1 with the lower line LL as a boundary.

Figure 17:
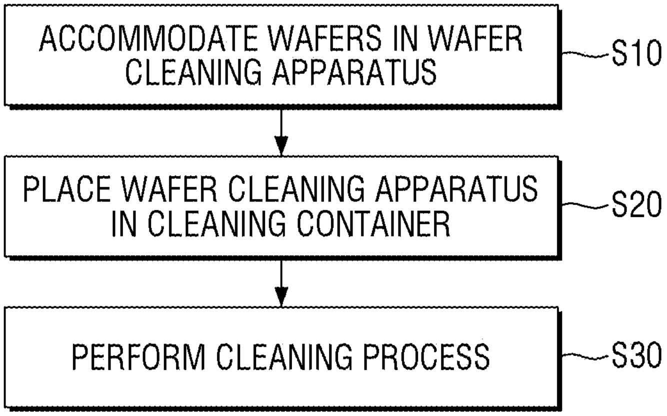
FIG. 17 is a flowchart of a method of manufacturing a semiconductor device according to an embodiment.

FIG. 17 is a flowchart of a method of manufacturing a semiconductor device according to an embodiment.

Referring to FIG. 17, an operation S10 of accommodating wafers in a wafer cleaning apparatus may be performed. The wafer cleaning apparatus may be one of the wafer cleaning apparatuses described previously. Accordingly, repeated descriptions on the wafer cleaning apparatus and the configuration of the wafers may be omitted.

Subsequently, an operation S20 of placing the wafer cleaning apparatus accommodating the wafers in a cleaning container may be performed. Accordingly, repeated descriptions on the cleaning container may be omitted.

Referring to FIGS. 8 to 11, the wafer cleaning apparatus 10 may accommodate the wafers W. The wafer W may be accommodated in the first accommodation space S1 (shown in FIG. 3) and the second accommodation space S2 (shown in FIG. 5). The wafer W may be disposed between the first plate PL1 and the second plate PL2. The wafer W may be disposed on the first connecting part CN1, the second connecting part CN2, and the shelf part S.

The wafer W may come into contact with the boundary connecting serrated parts BC (shown in FIG. 3), the connecting serrated part CT (shown in FIG. 3), the boundary shelf serrated parts BS (shown in FIG. 5), and the shelf serrated part ST (shown in FIG. 5).

The wafer W may be bulk silicon or silicon-on-insulator (SOI). In contrast, the wafer W may be a silicon wafer, or may include, but is not limited to, other materials, for example, silicon germanium, silicon germanium on insulator (SGOI), indium antimonide, lead telluride, indium arsenide, indium phosphide, gallium arsenide or gallium antimonide.

The distance between the adjacent wafers W may be constant. For example, the distances L1, L2, L3, and the like may be identical to each other. The distance LE of FIGS. 10 and 11 is equal to the interval between wafers W (e.g., the distances L1, L2, or L3).

Referring to FIG. 12, a cleaning container 20 is provided. A cleaning solution may be injected into the interior of the cleaning container 20 from the exterior of the cleaning container 20. The cleaning solution may be discharged from the interior of the cleaning container 20 to the exterior of the cleaning container 20. The wafer cleaning apparatus 10 having the wafers W may be placed into the cleaning container 20, which is filled with the cleaning solution.

The cleaning solution may be a solution capable of removing foreign substances on the wafer W. For example, the cleaning solution may be a phosphoric acid solution. The cleaning solution may remove foreign substances on the wafer W through a chemical reaction with the cleaning solution.

Subsequently, an operation s30 of performing a cleaning process may be performed to remove foreign substances through a chemical reaction.

The temperature of the heating part 23 may rise to a temperature higher than the boiling point of the cleaning solution in the cleaning container 20. When the temperature of the heating part 23 rises, the cleaning liquid in the cleaning container 20 may boil. While the wafer cleaning apparatus 10 accommodates the wafers W contained within the cleaning container 20, the wafer cleaning apparatus 10 or the cleaning container 20 may reciprocate up and down or side to side within a certain distance, thereby performing a wafer cleaning process. Generally, the reciprocating may induce damage on the outermost wafer. However, by using the configuration of the wafer cleaning apparatus and wafers accommodated therein, the damage may be significantly reduced.

During the cleaning process, the cleaning solution may continuously be injected into the interior of the cleaning container 20 and may be discharged from the interior of the cleaning container, thereby maintaining flow of the cleaning solution within the cleaning container 20. Generally, the flow of the cleaning solution may not be uniform throughout the cleaning container 20, and reciprocating may induce damage on the outermost wafer. However, by using the configuration of the wafer cleaning apparatus and wafers accommodated therein, the flow may be uniform and any damage may be significantly reduced.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A wafer cleaning apparatus comprising:

a plate extending in a first direction;

a connecting part extending from the plate in a second direction intersecting the first direction;

a boundary connecting serrated part protruding from the connecting part in the first direction, and connected to the plate;

a plurality of connecting serrated parts protruding from the connecting part in the first direction and spaced apart from the plate in the second direction, the plurality of connecting serrated parts including a first connecting serrated part closest to the boundary connecting serrated part, and a second connecting serrated part adjacent to the first connecting serrated part; and a plurality of first accommodation spaces provided between two adjacent ones of the plurality of connecting serrated parts and a second accommodation space between the first connecting serrated part and the boundary connecting serrated part, wherein:

the plurality of first accommodation spaces are configured to accommodate first wafers, and the second accommodation space is configured to accommodate a second wafer, the first connecting serrated part is disposed between the boundary connecting serrated part and the second connecting serrated part, the plurality of connecting serrated parts and the connecting part are directly connected to each other with a lower surface of the plurality of connecting serrated parts as a boundary, and upper surfaces of the plurality of connecting serrated parts have the same length in the second direction as each other, and when the first wafers having the same sizes as each other are disposed in the plurality of first accommodation spaces and the second wafer having the same size as the first wafers is disposed in the second accommodation space, a distance in the second direction between the second wafer and an inner wall of the plate is the same as a distance in the second direction between the second wafer and an adjacent first wafer.

2. The wafer cleaning apparatus of claim 1, wherein an upper surface of the boundary connecting serrated part and upper surfaces of the first and second connecting serrated parts are disposed on the same plane as each other.

3. The wafer cleaning apparatus of claim 1, wherein the plate includes a guide part having a shape of a circle that is cut along an upper boundary and a lower boundary spaced apart in the first direction, and a length of the lower boundary is longer than a length of the upper boundary.

4. The wafer cleaning apparatus of claim 1, wherein the plate includes a holder connecting part and a support part opposite the holder connecting part, wherein the support part has a hexagonal shape.

5. The wafer cleaning apparatus of claim 4, wherein the support part includes:

a side wall extending from the lower boundary in the first direction, a lower surface extending in a third direction intersecting the first direction and the second direction, and an inclined surface that connects the lower surface of the support part and the side wall of the support part, wherein a length of the lower surface of the support part in the third direction is smaller than the length of the lower boundary.

6. The wafer cleaning apparatus of claim 1, wherein the plate includes a holder connecting part and a support part opposite the holder connecting part, wherein the holder connecting part has a hexagonal shape.

7. The wafer cleaning apparatus of claim 6, wherein the holder connecting part includes:

a side wall extending from the upper boundary in the first direction, an upper surface extending in a third direction intersecting the first direction and the second direction, and an inclined surface that connects the upper surface of the holder connecting part and the side wall of the holder connecting part, wherein a length of the upper surface of the holder connecting part in the second direction is smaller than the length of the upper boundary in the second direction.

8. A wafer cleaning apparatus comprising:

a plate extending in a first direction;

a connecting part extending from the plate in a second direction intersecting the first direction;

a shelf part extending from the plate in the second direction;

a boundary connecting serrated part protruding from the connecting part in the first direction, and extending from the plate;

a plurality of connecting serrated parts protruding from the connecting part in the first direction and spaced apart from the plate in the second direction, the plurality of connecting serrated parts including a first connecting serrated part closest to the boundary connecting serrated part, and a second connecting serrated part adjacent to the first connecting serrated part;

a boundary shelf serrated part protruding from the shelf part in the first direction, and directly connected to the plate;

a plurality of shelf serrated parts protruding from the shelf part in the first direction and spaced apart from the plate in the second direction, the plurality of shelf serrated parts including a first shelf serrated part closest to the boundary shelf serrated part, and a second shelf serrated part adjacent to the first shelf serrated part;

a plurality of first accommodation spaces provided between two adjacent ones of the plurality of connecting serrated parts and a second accommodation space between the first connecting serrated part and the boundary connecting serrated part; and a plurality of third accommodation spaces provided between two adjacent ones of the plurality of shelf serrated parts and a fourth accommodation space between the first shelf serrated part and the boundary shelf serrated part, wherein:

the plurality of first accommodation spaces are configured to accommodate first wafers, and the second accommodation space is configured to accommodate a second wafer, the plurality of third accommodation spaces are configured to accommodate the first wafers, and the fourth accommodation space is configured to accommodate the second wafer, the first connecting serrated part is disposed between the boundary connecting serrated part and the second connecting serrated part, the plurality of connecting serrated parts and the connecting part are directly connected to each other with a lower surface of the plurality of connecting serrated parts as a boundary, and upper surfaces of the plurality of connecting serrated parts have the same length in the second direction as each other, a distance in the second direction between the second wafer and of an inner wall of the plate is the same as a distance in the second direction between the second wafer and adjacent one of second wafers, the first shelf serrated part is disposed between the boundary shelf serrated part and the second shelf serrated part, the plurality of shelf serrated parts and the shelf part are directly connected to each other with a lower surface of the plurality of shelf serrated parts as a boundary, and a distance of upper surfaces of the plurality of shelf serrated parts have the same length in the second direction as each other, and the connecting part and the shelf part are spaced apart from each other in a third direction intersecting the first direction and the second direction.

9. The wafer cleaning apparatus of claim 8, wherein a distance between adjacent two of the plurality of first accommodation spaces is equal to a distance between adjacent two of the plurality of third accommodation spaces.

10. The wafer cleaning apparatus of claim 8, wherein an upper surface of the boundary connecting serrated part and upper surfaces of the first and second connecting serrated parts are disposed on the same plane, and an upper surface of the boundary shelf serrated part and upper surfaces of the first and second shelf serrated parts are disposed on the same plane as each other.

11. The wafer cleaning apparatus of claim 8, wherein the plate includes a guide part having a shape of a circle that is cut along an upper boundary and a lower boundary spaced apart in the first direction, and a length of the lower boundary is longer than a length of the upper boundary.

12. The wafer cleaning apparatus of claim 8, wherein the plate includes a holder connecting part and a support part opposite the holder connecting part, wherein the support part has a hexagonal shape.

13. The wafer cleaning apparatus of claim 12, wherein the support part includes:

a side wall extending from the lower boundary in the first direction, a lower surface extending in the third direction, and an inclined surface that connects the lower surface of the support part and the side wall of the support part, wherein a length of the lower surface of the support part in the third direction is smaller than the length of the lower boundary.

14. The wafer cleaning apparatus of claim 8, wherein the plate includes a holder connecting part and a support part opposite the holder connecting part, wherein the holder connecting part has a hexagonal shape.

15. The wafer cleaning apparatus of claim 14, wherein the holder connecting part includes:

a side wall extending from the upper boundary in the first direction, an upper surface extending in the third direction, and an inclined surface that connects the upper surface of the holder connecting part and the side wall of the holder connecting part, wherein a length of the upper surface of the holder connecting part in the third direction is smaller than the length of the upper boundary.

16. A wafer cleaning system comprising:

a cleaning container;

a heating part formed on at least one surface of the cleaning container; and a wafer cleaning apparatus inserted into the cleaning container, wherein:

the wafer cleaning apparatus includes:

a plate extending in a first direction;

a connecting part extending from the plate in a second direction intersecting the first direction;

a boundary connecting serrated part protruding from the connecting part in the first direction, and directly connected to the plate;

a plurality of connecting serrated parts protruding from the connecting part in the first direction and spaced apart from the plate in the second direction, the plurality of connecting serrated parts including a first connecting serrated part closest to the boundary connecting serrated part, and a second connecting serrated part adjacent to the first connecting serrated part; and a plurality of first accommodation spaces provided between two adjacent ones of the plurality of connecting serrated parts and a second accommodation space between the first connecting serrated part and the boundary connecting serrated part, the plurality of first accommodation spaces are configured to accommodate first wafers, and the second accommodation space is configured to accommodate a second wafer, the first connecting serrated part is disposed between the boundary connecting serrated part and the second connecting serrated part, the plurality of connecting serrated parts and the connecting part are directly connected to each other with a lower surface of the plurality of connecting serrated parts as a boundary, and upper surfaces of the plurality of connecting serrated parts have the same length in the second direction as each other, and when the first wafers having the same sizes as each other are disposed in the plurality of first accommodation spaces and the second wafer having the same size as the first wafers is disposed in the second accommodation space, a distance in the second direction between the second wafer and an inner wall of the plate is the same as a distance in the second direction between the second wafer and an adjacent first wafer.

17. The wafer cleaning system of claim 16, further comprising a cleaning solution injected into the cleaning container, where the cleaning solution is configured to remove foreign substances through a chemical reaction.

18. The wafer cleaning system of claim 16, wherein:

the wafer cleaning apparatus further includes:

a shelf part extending from the plate in the second direction;

a boundary shelf serrated part protruding from the shelf part in the first direction, and directly connected to the plate;

a plurality of shelf serrated parts protruding from the shelf part in the first direction and spaced apart from the plate in the second direction, the plurality of shelf serrated parts including a first shelf serrated part closest to the boundary shelf serrated part, and a second shelf serrated part adjacent to the first shelf serrated part; and a plurality of third accommodation spaces provided between two adjacent ones of the plurality of shelf serrated parts and a fourth accommodation space between the first shelf serrated part and the boundary shelf serrated part, the plurality of third accommodation spaces are configured to accommodate the first wafers, and the fourth accommodation space is configured to accommodate the second wafer, the first shelf serrated part is disposed between the boundary shelf serrated part and the second shelf serrated part, the plurality of shelf serrated parts and the shelf part are directly connected to each other with a lower surface of the plurality of shelf serrated parts as a boundary, and a distance of upper surfaces of the plurality of shelf serrated parts have the same length in the second direction as each other, and the connecting part and the shelf part are spaced apart from each other in a third direction intersecting the first direction and the second direction.

19. The wafer cleaning system of claim 18, wherein an upper surface of the boundary connecting serrated part and upper surfaces of the first and second connecting serrated parts are disposed on the same plane, and an upper surface of the boundary shelf serrated part and upper surfaces of the first and second shelf serrated parts are disposed on the same plane.

20. The wafer cleaning system of claim 18, wherein, the plate includes a guide part having a shape of a circle that is cut along an upper boundary and a lower boundary spaced apart in the first direction, and wherein a length of the lower boundary is greater than a length of the upper boundary.

* * * * *